US00RE50657E

(19) United States
(12) Reissued Patent
Sakamoto et al.

(10) Patent Number: US RE50,657 E
(45) Date of Reissued Patent: Nov. 4, 2025

(54) SEMICONDUCTOR DEVICE FOR PREVENTING AN INCREASE IN RESISTANCE DIFFERENCE OF AN ELECTRODE LAYER

(71) Applicant: KIOXIA CORPORATION, Tokyo (JP)

(72) Inventors: Wataru Sakamoto, Yokkaichi (JP); Hiroshi Nakaki, Yokkaichi (JP); Hanae Ishihara, Yokkaichi (JP)

(73) Assignee: KIOXIA CORPORATION, Tokyo (JP)

(21) Appl. No.: 18/140,483

(22) Filed: Apr. 27, 2023

Related U.S. Patent Documents

Reissue of:
(64) Patent No.: 10,991,708
Issued: Apr. 27, 2021
Appl. No.: 16/333,096
PCT Filed: Sep. 21, 2016
PCT No.: PCT/JP2016/077889
§ 371 (c)(1),
(2) Date: Mar. 13, 2019
PCT Pub. No.: WO2018/055704
PCT Pub. Date: Mar. 29, 2018

(51) Int. Cl.
*H01L 27/11568* (2017.01)
*H01L 29/792* (2006.01)
(Continued)

(52) U.S. Cl.
CPC ..... *H10B 43/30* (2023.02); *H10B 43/20* (2023.02); *H10B 43/27* (2023.02); *H10B 43/40* (2023.02); *H10D 30/69* (2025.01); *H10B 43/50* (2023.02)

(58) Field of Classification Search
CPC ..... H01L 27/11568; H01L 27/11573; H01L 27/11578
See application file for complete search history.

(56) References Cited

U.S. PATENT DOCUMENTS 8,552,489 B2 10/2013 Eom et al.
8,649,227 B2 2/2014 Maeda
(Continued)

FOREIGN PATENT DOCUMENTS

JP 2007-266143 A 10/2007
JP 2007-334974 A 12/2007
(Continued)

OTHER PUBLICATIONS

International Search Report issued Nov. 22, 2016, in PCT/JP2016/077889, 2 pages.

*Primary Examiner* — Deandra M Hughes
(74) *Attorney, Agent, or Firm* — Oblon, McClelland, Maier & Neustadt, L.L.P.

(57) ABSTRACT

A semiconductor device of the embodiment includes a stacked body, a first insulating layer, first and second staircase portions 2, and a second insulating layer 46. The stacked body includes a first electrode layer 41 (WLDD) and a second electrode layer 41 (SGD). The first and second staircase portions 2 are provided in a first end portion 101 a second end region 102. The second insulating layer 46 extends in the X-direction. The second insulating layer divides the second electrode layer 41 (SGD) in the X-direction direction. A length L1 in the X-direction of the second insulating layer 46 is longer than a length L2 in the x-direction of the second electrode layer 41 (SGD) and shorter than a length L3 in the X-direction of the first electrode layer 41 (WLDD).

25 Claims, 30 Drawing Sheets

(51) Int. Cl.

| | |
|---|---|
| ***H10B 43/20*** | (2023.01) |
| ***H10B 43/27*** | (2023.01) |
| ***H10B 43/30*** | (2023.01) |
| ***H10B 43/40*** | (2023.01) |
| ***H10D 30/69*** | (2025.01) |
| *H10B 43/50* | (2023.01) |

(56) References Cited

U.S. PATENT DOCUMENTS

| | | | | |
|---|---|---|---|---|
| 8,697,498 | B2 | 4/2014 | Jang et al. | |
| 8,748,971 | B2 * | 6/2014 | Tanaka | H10D 30/0413 257/324 |
| 8,787,061 | B2 | 7/2014 | Kono | |
| 9,455,268 | B2 * | 9/2016 | Oh | H10B 43/50 |
| 2007/0252201 | A1 | 11/2007 | Kito et al. | |
| 2008/0173932 | A1 | 7/2008 | Kidoh et al. | |
| 2010/0207194 | A1 | 8/2010 | Tanaka et al. | H10D 30/0413 438/588 |
| 2011/0092038 | A1 | 4/2011 | Choi et al. | |
| 2011/0204420 | A1 | 8/2011 | Kim et al. | |
| 2011/0204421 | A1 | 8/2011 | Choi et al. | |
| 2012/0052674 | A1 | 3/2012 | Lee et al. | |
| 2012/0069662 | A1 | 3/2012 | Sakurai et al. | |
| 2012/0134210 | A1 | 5/2012 | Maeda | |
| 2012/0248525 | A1 | 10/2012 | Lee et al. | |
| 2013/0062681 | A1 * | 3/2013 | Fujiki | H10D 30/0413 438/269 |
| 2013/0119452 | A1 | 5/2013 | Endoh et al. | |
| 2013/0154055 | A1 * | 6/2013 | Park | H01L 28/60 257/532 |
| 2013/0228850 | A1 | 9/2013 | Tanaka et al. | |
| 2014/0092684 | A1 | 4/2014 | Maeda | |
| 2014/0162420 | A1 * | 6/2014 | Oh | H01L 27/11582 438/270 |
| 2015/0004777 | A1 | 1/2015 | Kohji et al. | |
| 2015/0009755 | A1 | 1/2015 | Maeda | |
| 2015/0102449 | A1 | 4/2015 | Kudo | |
| 2015/0109862 | A1 | 4/2015 | Shibata et al. | G11C 8/14 257/314 |
| 2015/0137216 | A1 | 5/2015 | Lee et al. | H10D 30/0411 257/329 |
| 2015/0221667 | A1 | 8/2015 | Fukuzumi et al. | H10B 43/50 257/314 |
| 2015/0371710 | A1 | 12/2015 | Maeda | |
| 2016/0035741 | A1 * | 2/2016 | Tajima | H01L 29/04 257/324 |
| 2016/0056171 | A1 | 2/2016 | Manorotkul et al. | |
| 2016/0190147 | A1 * | 6/2016 | Kato | H10B 41/10 257/315 |
| 2016/0336336 | A1 * | 11/2016 | Nagashima | H10B 41/40 |
| 2017/0069635 | A1 * | 3/2017 | Tajima | H10B 43/27 |
| 2017/0117288 | A1 * | 4/2017 | Maegawa | H10B 43/35 |
| 2017/0162324 | A1 | 6/2017 | Shimoda et al. | |
| 2017/0162593 | A1 * | 6/2017 | Shimura | H10B 43/27 |
| 2017/0179150 | A1 * | 6/2017 | Shimura | H10B 43/10 |
| 2017/0213840 | A1 * | 7/2017 | Sudo | H10D 64/037 |
| 2017/0263625 | A1 * | 9/2017 | Kikutani | H01L 23/5283 |
| 2017/0271255 | A1 * | 9/2017 | Okamoto | H10B 43/27 |
| 2017/0338240 | A1 * | 11/2017 | Nogami | H10B 43/35 |
| 2018/0247955 | A1 * | 8/2018 | Iida | H01L 27/11565 |
| 2019/0088586 | A1 * | 3/2019 | Ichinose | H01L 27/0629 |
| 2019/0279878 | A1 * | 9/2019 | Furukawa | H01L 27/11575 |

FOREIGN PATENT DOCUMENTS

| | | | |
|---|---|---|---|
| JP | 2008-171918 | A | 7/2008 |
| JP | 2010-192569 | A | 9/2010 |
| JP | 2011-171735 | A | 9/2011 |
| JP | 2012-69695 | A | 4/2012 |
| JP | 2012-119013 | A | 6/2012 |
| JP | 2015-149413 | A | 8/2015 |
| TW | 201203523 | A1 | 1/2012 |
| TW | 201517255 | A | 5/2015 |
| TW | 201606148 | A | 2/2016 |

* cited by examiner

FIRST EMBODIMENT

FIG. 8 REFERENCE EXAMPLE
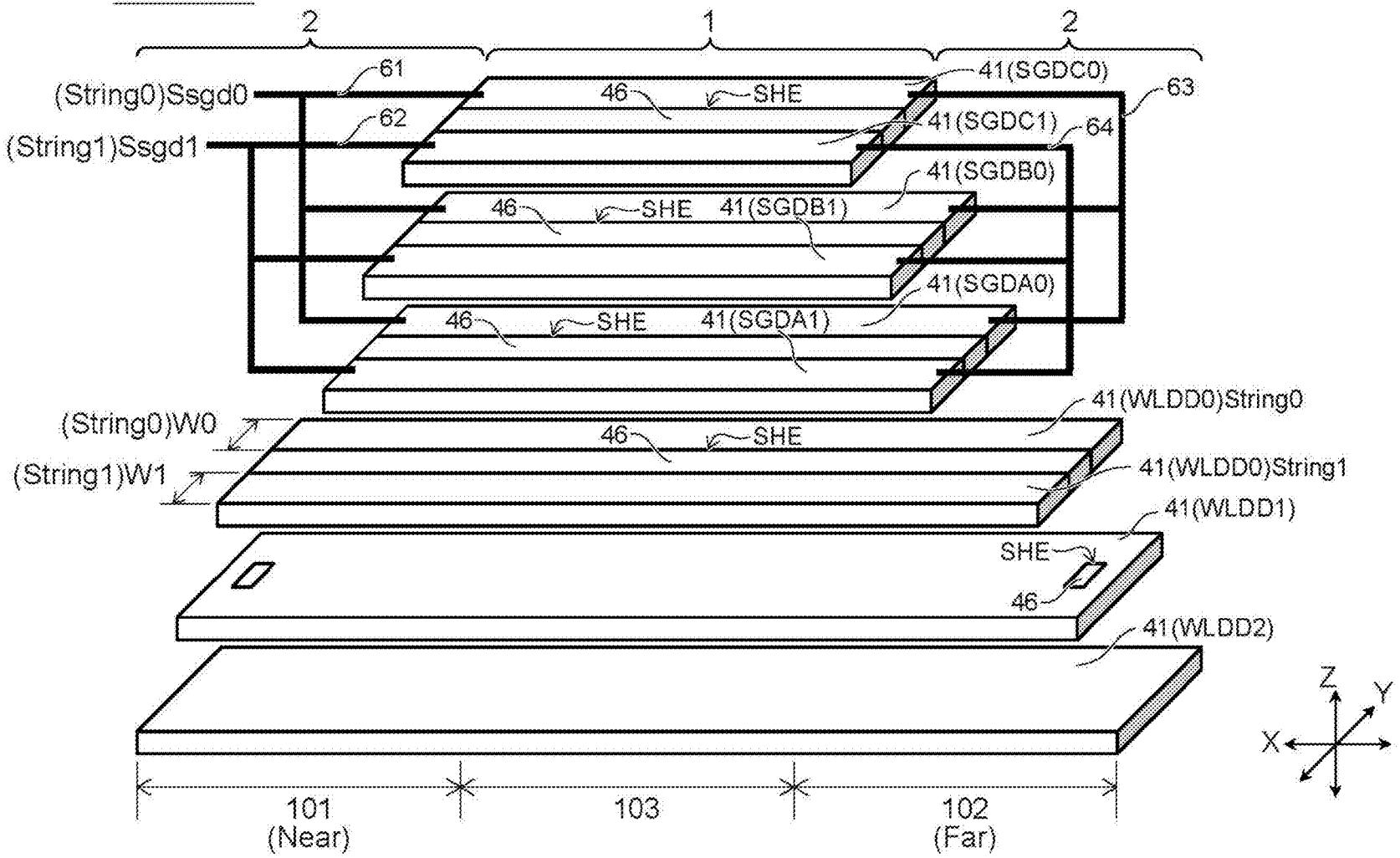

REFERENCE EXAMPLE

REFERENCE EXAMPLE

SECOND EMBODIMENT

THIRD EMBODIMENT

100
SHE
48
46
70
71
MH
MH SHE
MH 46
MH 46 48
30 20 50
CL
CL(CLctr)
40
47
43
Z
Y
X

SEMICONDUCTOR DEVICE FOR PREVENTING AN INCREASE IN RESISTANCE DIFFERENCE OF AN ELECTRODE LAYER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a reissue application of U.S. Pat. No. 10,991,708 issued Apr. 27, 2021, from U.S. application No. 16/333,096.*

TECHNICAL FIELD

Embodiments described herein relate generally to a semiconductor device and a method of manufacturing a semiconductor device.

BACKGROUND ART

There has been proposed a memory device with a three-dimensional structure in which a memory hole is formed in a stacked body in which multiple electrode layers are stacked and a charge storage film and a semiconductor film are extended in a stacking direction of the stacked body in the memory hole. The memory device has multiple memory cells (MC) connected in series between a drain-side select transistor (STD) and a source-side select transistor (STS). The structure where STD, MC, and STS are connected in series is called a "memory string (or a NAND string)". The electrode layer is gate electrodes (a drain-side selection gate SGD, a word line WL, and a source-side selection gate SGS) of the STD, the MC, and the STS. In the stacked body, multiple slits starting from an upper surface of the stacked body and reaching the substrate are formed. A region between the slits is called a "block". The number of SGDs provided in one "block" is typically "one". In recent years, there has been proposed a memory device in which two SGDs are juxtaposed in one "block". When operating the memory device, one of the two SGDs is "selected". A memory string including the selected SGD is electrically connected to a bit line BL. In such a memory device, there is a circumstance that a high-resistance electrode layer may be likely to occur. For example, when a high resistance electrode layer occurs, the resistance of the electrode layer is changed for every memory string. Thus, for example, the resistance difference of the word WL is increased between memory strings. It is desired to prevent an increase in resistance difference of the electrode layer.

CITATION LIST

Patent Literature

[Patent Literature 1] US 2015/0109862

[Patent Literature 2] U.S. Pat. No. 8,697,982

[Patent Literature 3] U.S. Pat. No. 8,787,061

SUMMARY OF THE INVENTION

Technical Problem

Embodiments provide a semiconductor device capable of preventing an increase in resistance difference of an electrode layer and a method of manufacturing the semiconductor device.

Solution to Problem

The semiconductor device of the embodiment includes a stacked body, at least two first insulating layers, a first staircase portion, a second staircase portion, and a second insulating layer. The stacked body includes a first electrode layer and a second electrode layer provided to be electrically insulated from the first electrode layer in a stacking direction. The at least two first insulating layers are provided in the stacked body to range from an upper end of the stacked body to a lower end of the stacked body and extend in a first direction intersecting the stacking direction. The first staircase portion is provided in a first end region of the stacked body between the at least two first insulating layers. The second staircase portion is provided in a second end region of the stacked body located on a side opposite to the first end region between the at least two first insulating layers. The second insulating layer extends in the first direction and is provided in the stacked body between the at least two first insulating layers. The second insulating layer divides the second electrode layer in the first direction. A length in the first direction of the second insulating layer is longer than a length in the first direction of the second electrode layer and shorter than a length in the first direction of the second electrode layer.

BRIEF DESCRIPTION OF DRAWINGS

FIG. 8 is a schematic perspective view of a semiconductor device of a reference example;

DESCRIPTION OF EMBODIMENTS

Figure 1:
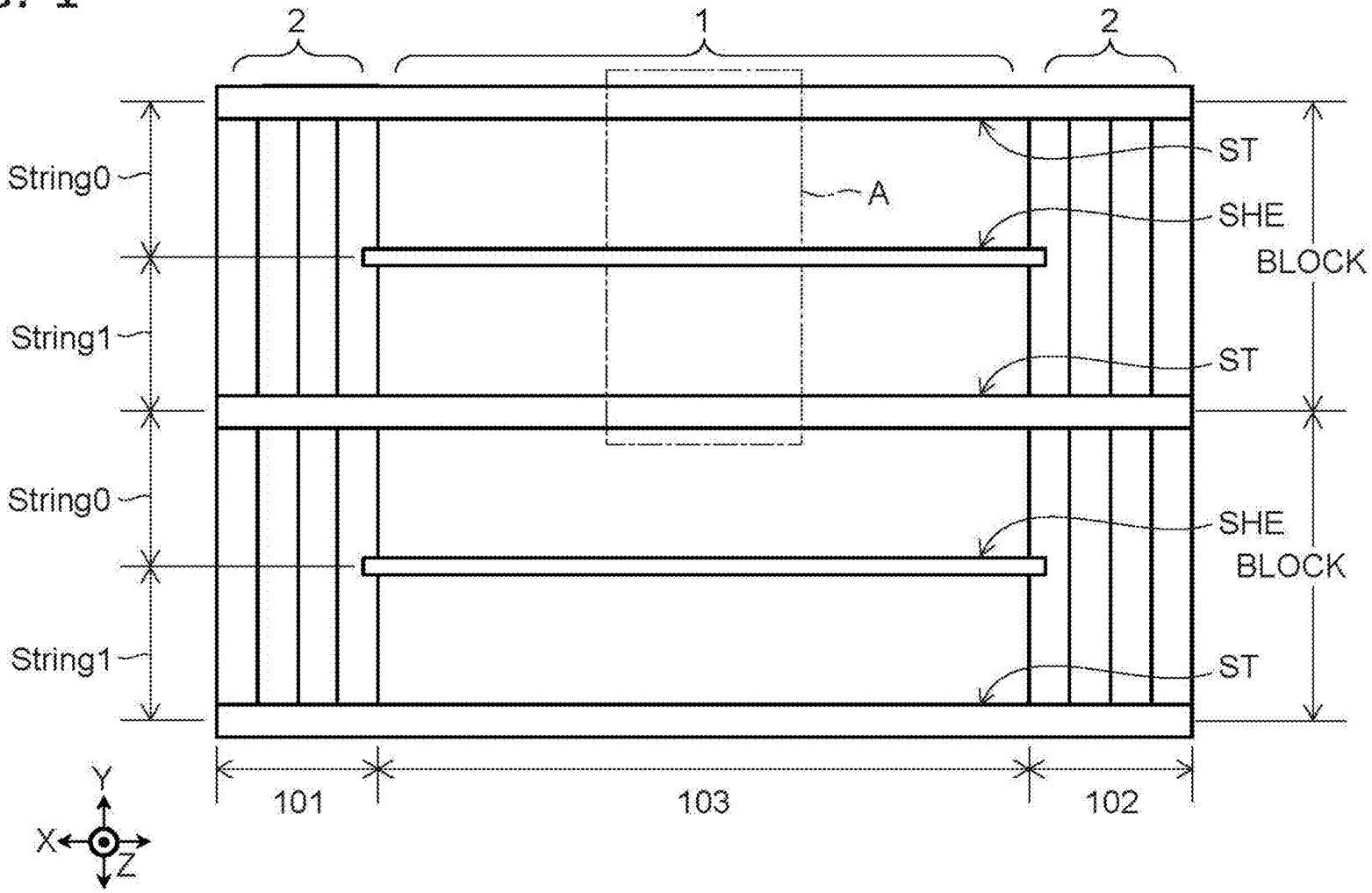
FIG. 1 is a schematic plan view of a semiconductor device of a first embodiment.

Hereinafter, embodiments will be described with reference to the drawings. In each figure, the same components are denoted by the same reference numerals. In the embodiment, "up" denotes a direction away from, for example, a substrate, and "down" denotes a direction towards, for example, a substrate. The semiconductor device of the embodiment is a semiconductor storage device having a memory cell array.

First Embodiment

<Semiconductor Device>

Figure 2:
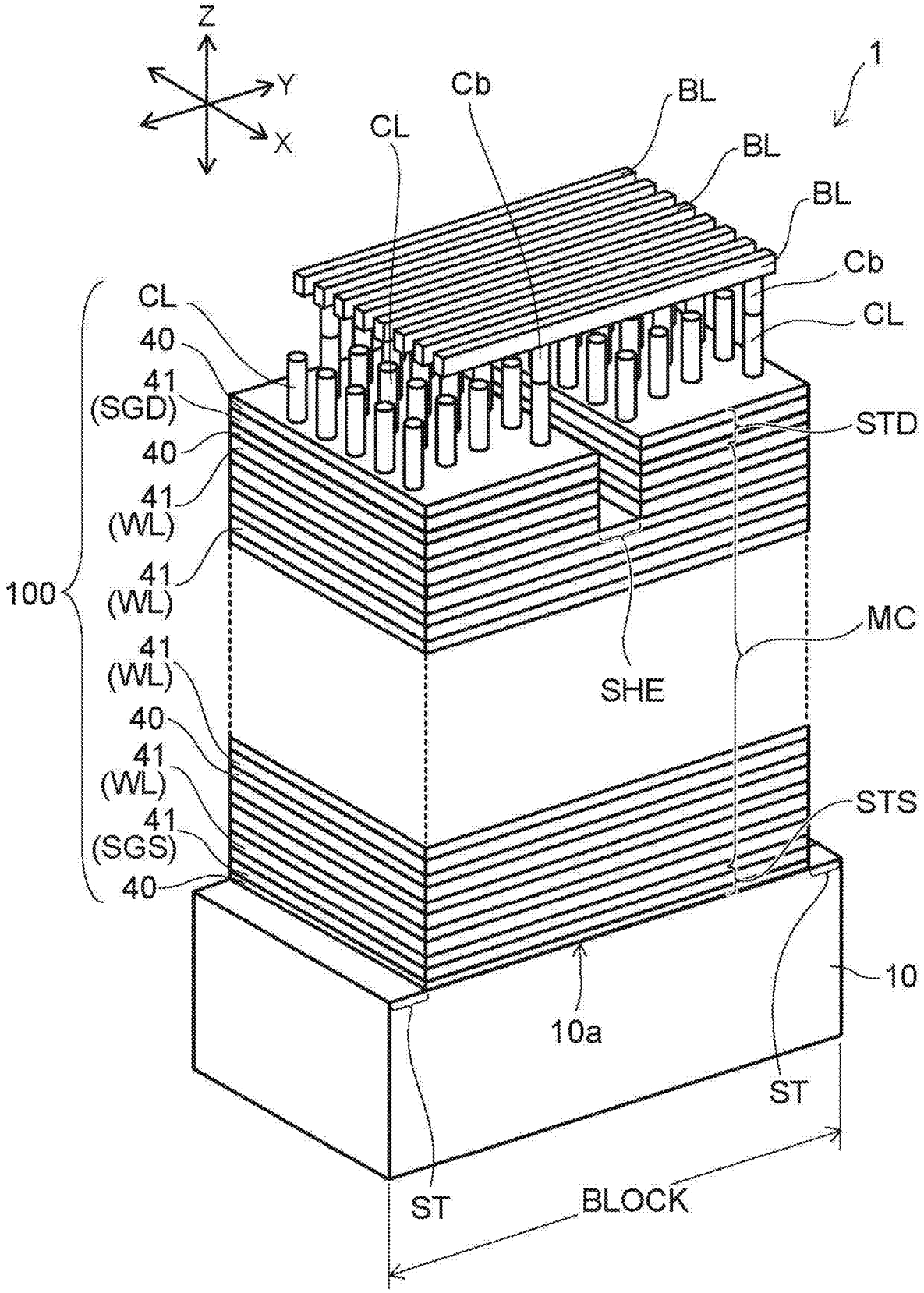
FIG. 2 is a schematic perspective view of the inside of a one-dot chain line frame A in FIG. 1.

FIG. 1 is a schematic plan view of a semiconductor device of a first embodiment. FIG. 2 is a schematic perspective view of the inside of a one-dot chain line frame A in FIG. 1. In FIG. 1 and FIG. 2, two directions parallel to a major surface of a substrate 10 and perpendicular to each other are defined as an X-direction (first direction) and a Y-direction (second direction), and a direction intersecting, for example, a direction perpendicular to both the X-direction and the Y-direction is defined as a Z-direction (stacking direction of a stacked body 100).

As shown in FIG. 1 and FIG. 2, the semiconductor device of the first embodiment includes a memory cell array 1 and a staircase portion 2. The memory cell array 1 and the staircase portion 2 are provided in the stacked body 100. The stacked body 100 is provided on a major surface 10a of the substrate 10. The substrate 10 includes, for example, a crystallized silicon layer. The conductivity type of the silicon layer is, for example, a p-type.

In the range shown in FIG. 1, two staircase portions 2 are shown. One of the staircase portions 2 is provided in a first end region 101 of the stacked body 100. The other staircase portion 2 is provided in a second end region 102 of the stacked body 100. The second end region 102 is on a side opposite to the first end region 101 in the X-direction. The memory cell array 1 is provided in an intermediate region 103 between the first end region 101 and the second end region 102. In the range shown in FIG. 1, the memory cell array 1 is adjacent to the two staircase portions 2 in the X-direction.

The stacked body 100 includes multiple insulators 40 and multiple electrode layers 41 which are alternately stacked. The electrode layer 41 contains a conductive material. The conductive material is, for example, conductive silicon (Si), tungsten (W), molybdenum (Mo), or the like. The insulator 40 contains an insulating material, which is, for example, silicon oxide. The insulating material may be an air gap. The electrode layer 41 is provided in the stacked body 100 so as to be electrically insulated in the Z-direction by the insulator 40.

The electrode layer 41 includes at least one source-side selection gate (SGS), multiple word lines (WL), and at least one drain-side selection gate (SGD). SGS is a gate electrode of a source-side select transistor (STS). WL is a gate electrode of a memory cell (MC). SGD is a gate electrode of a drain-side select transistor (STD). Any number of electrode layers 41 may be stacked.

The SGS is provided in a lower region of the stacked body 100. The SGD is provided in an upper region of the stacked body 100. The lower region denotes the region of the stacked body 100 close to the substrate 10, and the upper region denotes the region of the stacked body 100 far from the substrate 10. For example, at least one of the multiple electrode layers 41 including the electrode layer 41 closest to the substrate 10 is the SGS. At least one of the multiple electrode layers 41 including the electrode layer 41 farthest from the substrate 10 is the SGD. The WL is provided between the SGS and the SGD.

The semiconductor device of the first embodiment has multiple MCs connected in series between the STD and the STS. The structure where the STD, the MC, and the STS are connected in series is called a "memory string (or a NAND string)". The memory string is connected to a bit line (BL), for example, via a contact Cb. The BL is provided above the stacked body 100 and extends in the Y-direction.

Figure 3:
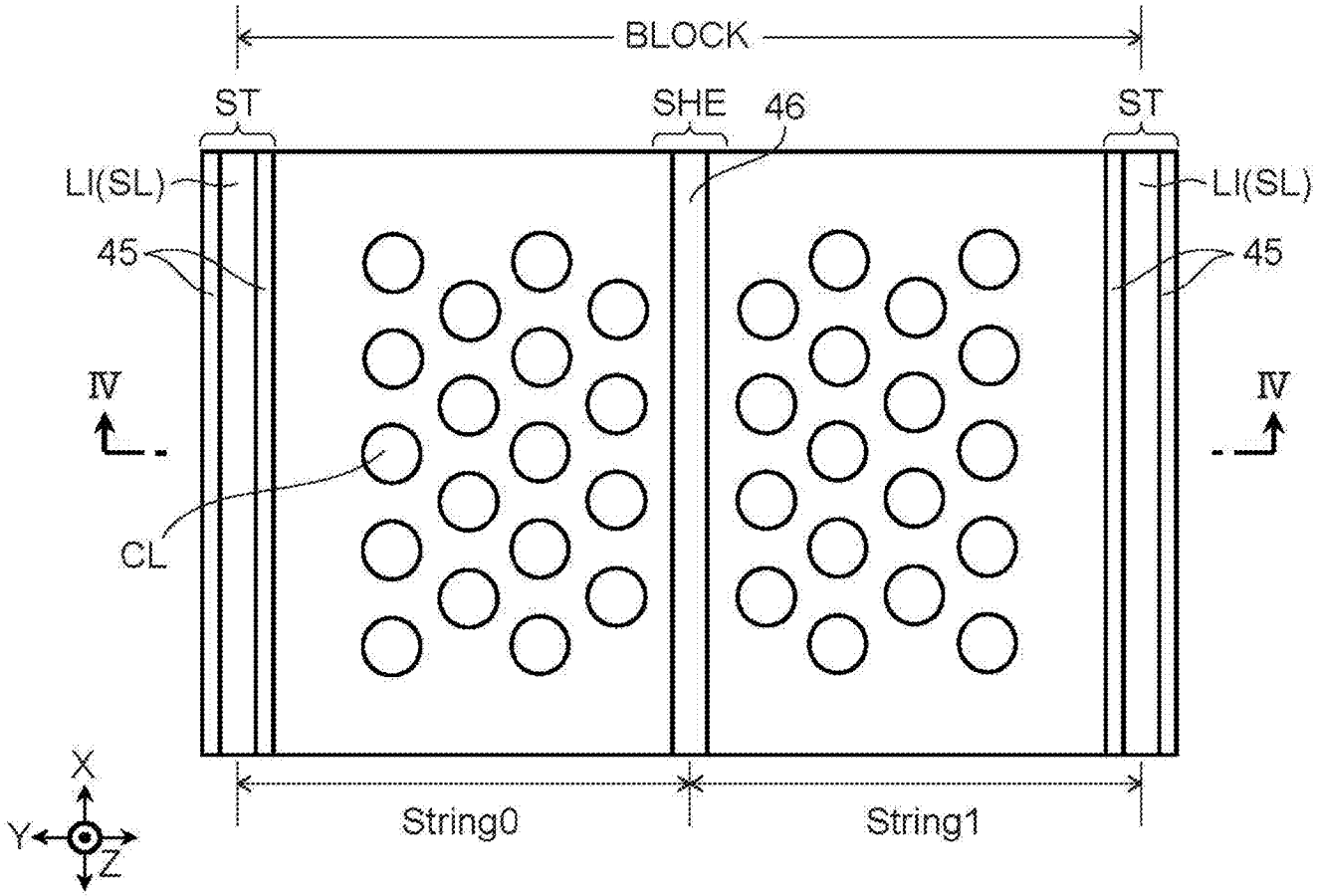
FIG. 3 is a schematic plan view of the inside of the one-dot chain line frame A in FIG. 1.
Figure 4:
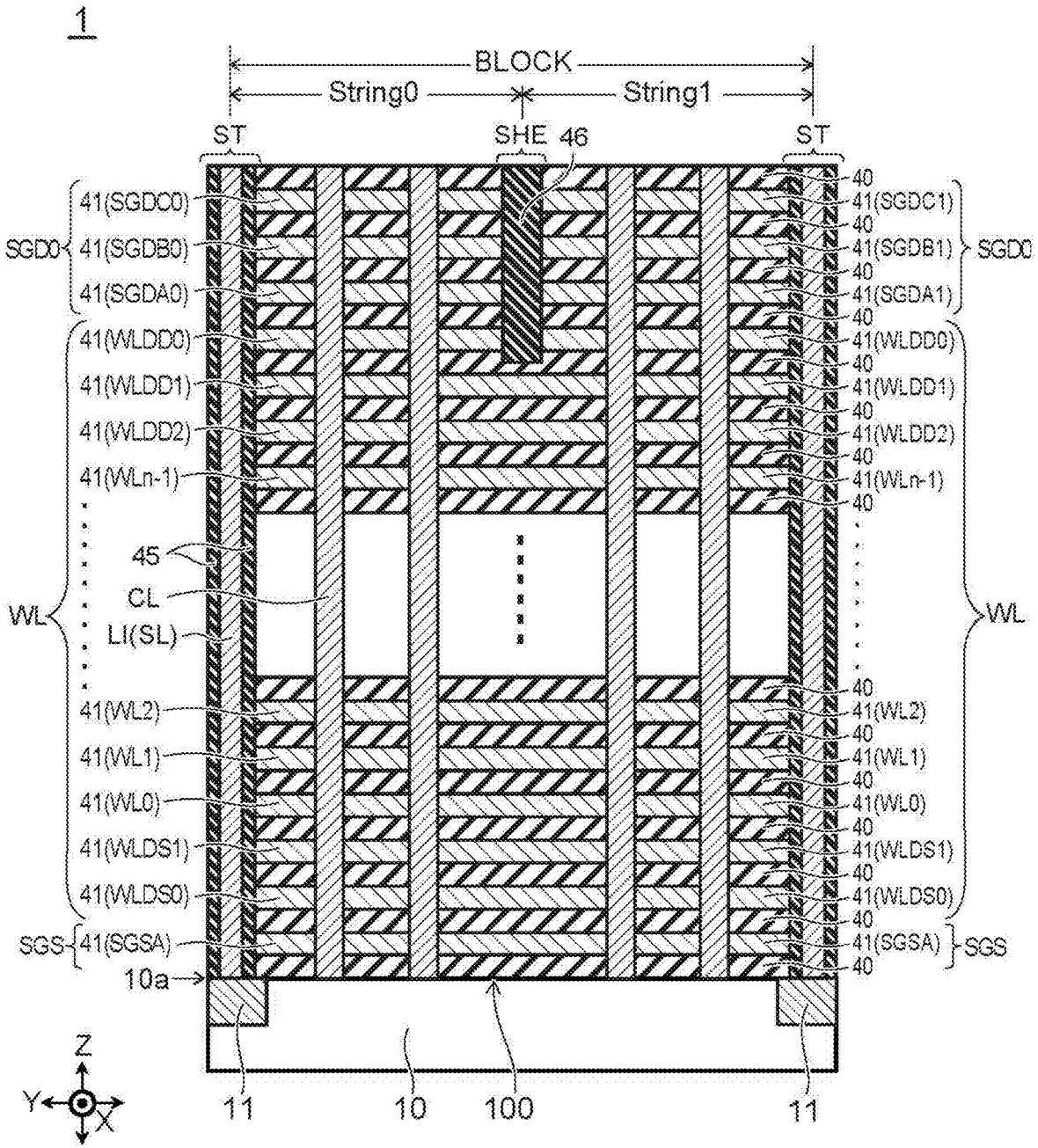
FIG. 4 is a schematic cross-sectional view taken along line IV-IV in FIG. 3.

FIG. 3 is a schematic plan view of the inside of the one-dot chain line frame A in FIG. 1. FIG. 4 is a schematic cross-sectional view taken along line IV-IV in FIG. 3.

In the stacked body 100, a first slit ST, a second slit SHE, and a column-shaped portion CL are provided.

The first slit ST is provided to range from the upper end of the stacked body 100 to the lower end of the stacked body 100. In the range shown in FIG. 3 and FIG. 4, two first slits ST are shown. The two first slits extend in the X-direction.

A first insulating layer 45 is provided on the side wall of the first slit ST. The first insulating layer 45 contains an insulating material. The insulating material is, for example, silicon oxide. The stacked body 100 is divided in the X-direction by the first insulating layer 45. The region of the stacked body 100 interposed between the two first slits is called block (BLOCK). The BLOCK becomes, for example, a minimum unit of information erase. The erase size is set to one BLOCK or a combination of multiple BLOCKs.

A conductive layer LI is provided along the first insulating layer 45 in the first slit ST. The conductive layer LI reaches the substrate 10. An n-type semiconductor layer 11 is provided in the substrate 10. The conductive layer LI is electrically connected to the semiconductor layer 11. The conductive layer LI contains a conductive material. The conductive material is, for example, W. The conductive layer LI functions as, for example, a source line (SL).

The second slit SHE is provided in the BLOCK of the stacked body 100. The second slit SHE extends in the X-direction. Unlike the first slit ST, the second slit SHE needs not to be provided to range from the upper end of the stacked body 100 to the lower end of the stacked body 100. The second slit SHE may divide the SGD into, for example, two SGDs in the X-direction within one BLOCK. A second insulating layer 46 is provided in the second slit SHE. The second insulating layer 46 contains an insulating material. The insulating material is, for example, silicon oxide. The second insulating layer 46 extends in the X-direction and divides the SGD into two SGDs in the X-direction. In the specification, one of the two divided SGDs is called an "SGD0", and the other one is called an "SGD1". The memory string including the SGD0 belongs to "String0". The memory string including the SGD1 belongs to "String1". The "String0" and the "String1" are connected in parallel between the SL and the BL.

In the semiconductor device shown in FIG. 4, the SGD0 includes three of SGDA0 to SGDC0. The SGDA0 to the SGDC0 are electrically connected to each other. The SGD1 includes three of SGDA1 to SGDC1. The SGDA1 to the SGDC1 are electrically connected to each other. The SGS includes one SGSA. The WL includes a drain-side dummy word line (WLDD) and a source-side dummy word line (WLDS) in addition to n WLs of WL0 to WLn-1 actually used.

The WLDD is provided between the WLn-1 and the SGDA0 and between the WLn-1 and the SGDA1. The WLDD of the embodiment includes three of WLDD0 to WLDD2.

The WLDS is provided between the WL 0 and the SGSA. The WLDS of the embodiment includes two of WLDS0 to WLDS1.

The column-shaped portion CL is provided in the intermediate region 103 of the stacked body 100 shown in FIG. 1. The column-shaped portion CL extends in the Z-direction and is provided to range from the upper end of the stacked body 100 to the lower end of the stacked body 100.

Figure 5:
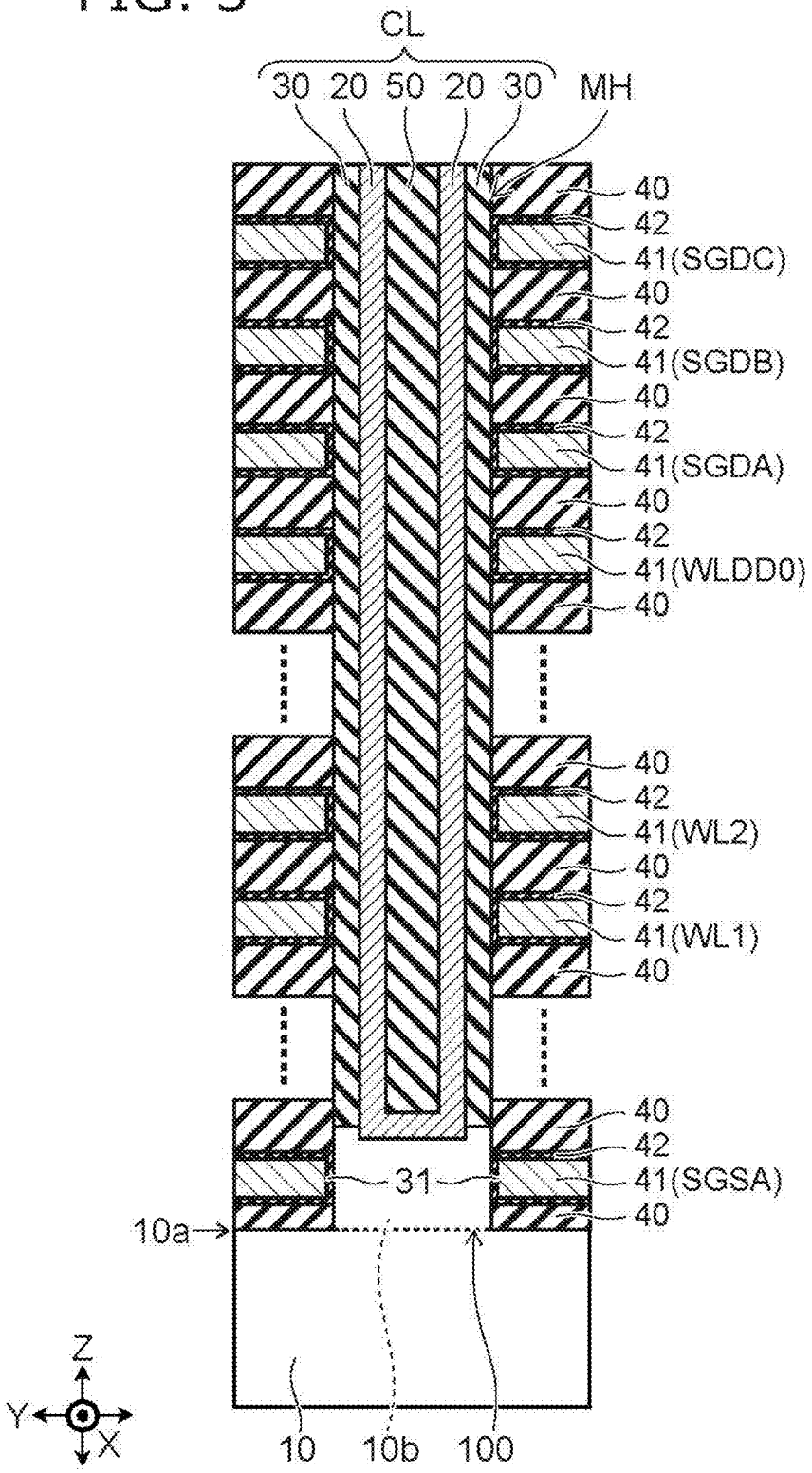
FIG. 5 is an enlarged schematic cross-sectional view showing one example of the column-shaped portion.

FIG. 5 is an enlarged schematic cross-sectional view showing one example of the column-shaped portion. The cross section shown in FIG. 5 corresponds to, for example, the cross section shown in FIG. 4.

As shown in FIG. 5, a memory hole MH is provided in the stacked body 100. The memory hole MH is an opening extending in the Z-direction. The column-shaped portion CL is provided in the memory hole MH. The memory hole MH is formed in a column shape or an elliptical column shape. The lower end of the memory hole MH reaches the substrate 10.

The column-shaped portion CL includes a memory film 30, a semiconductor body 20, and a core layer 50. The memory film 30, the semiconductor body 20, and the core layer 50 are provided in the memory hole MH. The memory film 30 includes a charge storage portion in the film. The charge storage portion includes, for example, a trap site that traps charges and/or a floating gate. The threshold voltage of the MC varies depending on the presence or absence of charges or the amount of charges in the charge storage portion. Accordingly, the MC retains information. Although omitted in FIG. 5, the memory film 30 has a tunnel insulating film between the charge storage portion and the semiconductor body 20.

Similarly, although omitted in FIG. 5, the memory film 30 is provided with a first block insulating film between the charge storage portion and the electrode layer 41. When erasing information and programing information, in the tunnel insulating film, charge tunneling, for example, electron and hole tunneling occurs. The memory film 30 may be removed in the portion where the electrode layer 41 which is to be the SGD (SGDA to SGDC) is formed. In this case, instead of the memory film 30, a gate insulating film of the STD is provided.

The semiconductor body 20 extends in the Z-direction. The semiconductor body 20 contains, for example, crystallized P-type silicon. The semiconductor body 20 is electrically connected to the substrate 10 via, for example, a semiconductor pillar 10b. The semiconductor pillar 10b is provided on the bottom of the memory hole MH. The semiconductor pillar 10b contains, for example, crystallized P-type silicon. The semiconductor pillar 10b is in contact with the substrate 10 and constitutes a portion of the substrate 10. The semiconductor pillar 10b faces, for example, the electrode layer 41 (SGSA) via a gate insulating film 31. The semiconductor pillar 10b may be omitted. In a case where the semiconductor pillar 10b is omitted, for example, the memory film 30 and the semiconductor body 20 extend to the portion where the STS is formed, and the semiconductor body 20 is in direct contact with the substrate 10.

The core layer 50 contains an insulating material. The insulating material is, for example, silicon oxide. The core layer 50 buries the memory hole MH provided with the memory film 30 and the semiconductor body 20.

A second block insulating film 42 is provided between the electrode layer 41 and the insulator 40 and between the electrode layer 41 and the memory film 30. The second block insulating film 42 contains, for example, silicon oxide and aluminum oxide. The second block insulating film 42 prevents back tunneling of charges from the WL to the charge storage portion in the memory film 30, for example, during the erasing operation.

Figure 6:
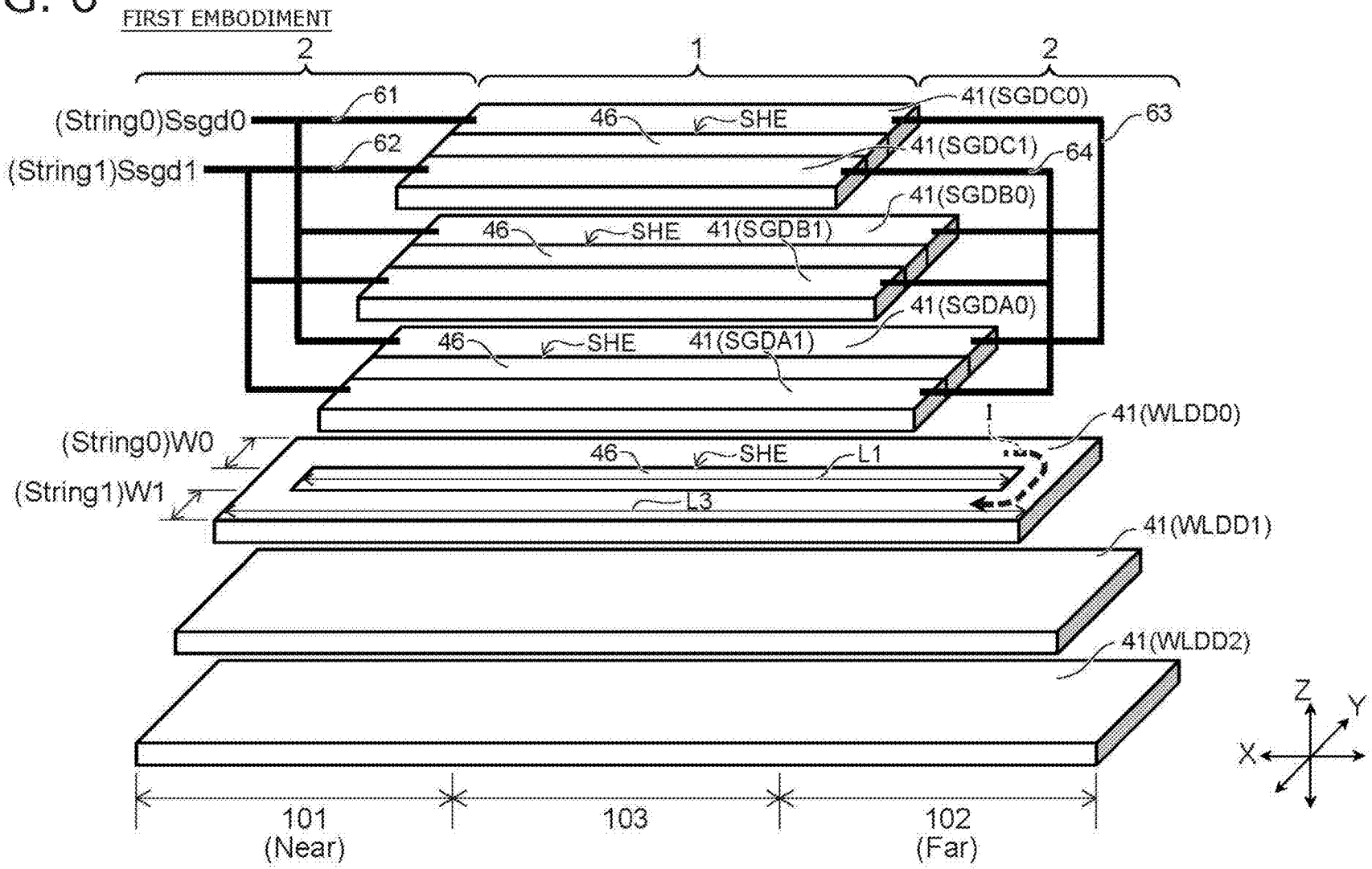
FIG. 6 is a schematic perspective view of the semiconductor device of the first embodiment.
Figure 7:
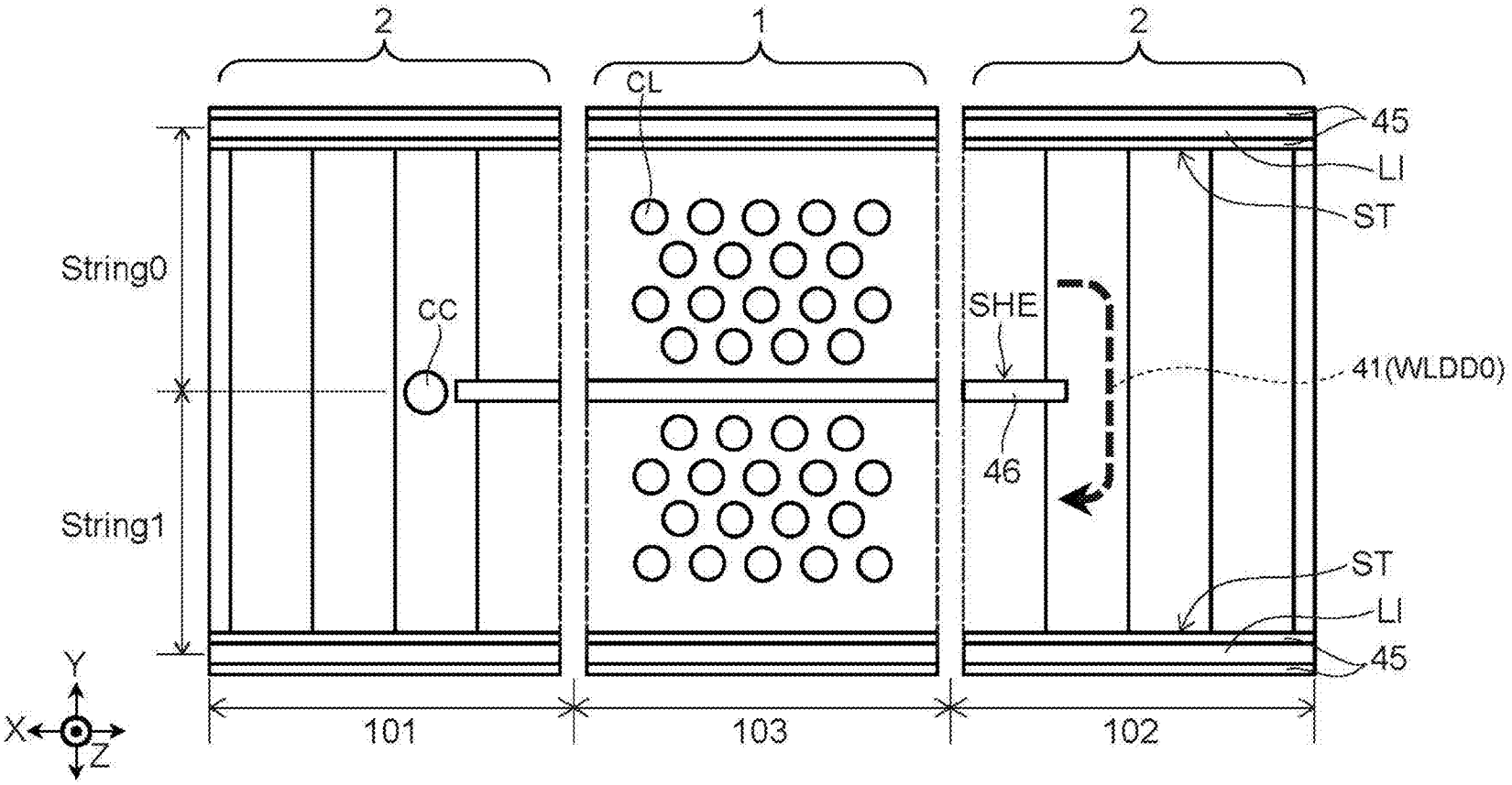
FIG. 7 is a schematic plan view of the semiconductor device of the first embodiment.

FIG. 6 is a schematic perspective view of the semiconductor device of the first embodiment. FIG. 6 shows the electrode layers 41 (SGDA0 to SGDC 3, WLDD0, WLDD, and WLn-1). FIG. 7 is a schematic plan view of the semiconductor device of the first embodiment.

As shown in FIGS. 6 and 7, the second insulating layer 46 divides the three electrode layers 41 which are to be the SGDs into six electrode layers 41 (SGDA0) to 41 (SGDC3) in the X-direction. The electrode layers 41 (SGDA0) to 41 (SGDC0) belong to the String0.

For example, a signal Ssgd0 is commonly supplied from a drain-side selection gate driving circuit (not shown) to the electrode layers 41 (SGDA0) to 41 (SGDC0) via a first interconnection 60. The first interconnection 61 is provided, for example, above the first end region 101.

The electrode layers 41 (SGDA1) to 41 (SGDC1) belongs to the String1. For example, a signal Ssgd1 is commonly supplied to the electrode layers 41 (SGDA1) to 41 (SGDC1) from a drain-side selection gate driving circuit (not shown) via a second interconnection 62. The second interconnection 61 is provided, for example, above the first end region 101.

A third interconnection 63 is provided above the second end region 102. The third interconnection 63 short-circuits the electrode layers 41 (SGDA0) to 41 (SGDC0) with each other in the second end region 102. Similarly, a fourth interconnection 64 is provided above the second end region 102. The fourth interconnection 64 short-circuits the electrode layers 41 (SGDA1) to 41 (SGDC1) with each other in the second end region.

The second insulating layer 46 reaches one of the electrode layers 41 which are to be the WL, for example, the electrode layer 41 which is to be the WLDD. In FIG. 6, the second insulating layer 46 reaches the electrode layer 41 (WLDD0).

The length L1 of the second insulating layer 46 in the X-direction is greater than the length L2 of each of the electrode layer 41 (SGDA0) and the electrode layer 41 (SGDA1) in the X-direction. The electrode layer 41 (SGDA0) and the electrode layer 41 (SGDA1) are the electrode layers having the longest length in the X-direction among the electrode layers 41 which are to be the SGD.

However, the length L1 of the second insulating layer 46 of the first embodiment in the X-direction is smaller than the length L3 of the electrode layer 41 (WLDD0) in the X-direction. The electrode layer 41 (WLDD0) is the electrode layer having the shortest length in the X-direction among the electrode layers 41 which are to be the WL.

According to the first embodiment, even if the second insulating layer 46 reaches the electrode layer 41 which is to be the WL and the second insulating layer 46 completely penetrates, for example, the electrode layer 41 which is to be the WL, the electrode layer 41 which is to be the WL can be prevented from being divided by the second insulating layer 46. For example, in the example shown in FIG. 6 and FIG. 7, the electrode layer 41 (WLDD0) may be connected in both the first end region 101 and the second end region 102.

For example, when the electrode layer 41 (WLDD0) is divided by the second insulating layer 46, the following situation occurs.

FIG. 8 is a schematic perspective view of a semiconductor device of a reference example. The portions shown in FIG. 8 correspond to the portions shown in FIG. 6.

As shown in FIG. 8, when the electrode layer 41 (WLDD0) is divided by the second insulating layer 46, for example, the resistance of the electrode layer 41 is increased as compared with the undivided electrode layer 41 (WLDD1). For example, the width of the electrode layer 41 (WLDD0) in the Y-direction is decreased by the amount of the second insulating layer 46 provided. For this reason, the cross-sectional area of the electrode layer 41 (WLDD0) in the Y-direction is decreased, and thus, the resistance is increased.

For the reference example, in the first embodiment, as shown in FIGS. 6 and 7, the electrode layer 41 (WLDD0) remains connected, for example, in both the first end region 101 and the second end region 102. For this reason, even if the second insulating layer 46 is penetrated, the electrode layer 41 (WLDD0) has a "resistance of parallel connection" in terms of an equivalent circuit. Therefore, according to the first embodiment, it is possible to prevent an increase in resistance of the electrode layer 41 (WLDD0) as compared with the reference example shown in FIG. 8.

In the reference example shown in FIG. 8, it is assumed that a connection node between a word line driving circuit (not shown) and the electrode layer 41 (WLDD0) is provided in the first end region 101. In this case, the electrode layer 41 (WLDD0) is charged and discharged from the first end region 101 towards the second end region 102. In the figure, "Near" indicates a side close to the connection node, and "Far" indicates a side far from the connection node.

Herein, it is assumed that the width W0 on the String0 side and the width W1 on the String1 side in the Y-direction of the electrode layer 41 (WLDD0) are different. In this case, the resistance of the electrode layer 41 (WLDD0) on the String° side and the resistance of the electrode layer 41 (WLDD0) on the String1 side are different. For this reason, a difference occurs between the charging/discharging time of the electrode layer 41 (WLDD0) on the String0 side and the charging/discharging time of the electrode layer 41 (WLDD0) on the String1 side.

The difference in charging/discharging time becomes a delay difference between the "rising/falling time" of the electrode layer 41 (WLDD0) in the String0 and the "rising/falling time" of the electrode layer 41 (WLDD0) in the String1.

In order to correctly operate the semiconductor device, the operation timing needs to be coincident with one String with a slow "rising/falling time" between the String0 and the String1. This hinders the improvement of the performance of the semiconductor device, for example, speeding up the operation.

In contrast to such a reference example, in the first embodiment, as shown in FIGS. 6 and 7, the electrode layer 41 (WLDD0) is connected in the second end region 102. For this reason, in the second end region 102, the charging/discharging is performed from the String with a fast "rising/falling time" between the String0 and the String1 toward the String with a slow "rising/falling time".

In the example shown in FIGS. 6 and 7, it is assumed that the "rising/falling time" in the String0 is faster than the "rising/falling time" in the String1. In this case, the charging/discharging of the electrode layer 41 (WLDD0) in the String0 is completed before the charging/discharging of the electrode layer 41 (WLDD0) in the String1. When the charging/discharging of the String0 reaches the second end region 102, the charging/discharging is repeatedly performed toward the String1. The direction in which the charging/discharging is performed is indicated by a "dotted arrow" in FIGS. 6 and 7. Reference numeral "CC" shown in FIG. 7 indicates a connection node between a word line driving circuit (not shown) and the electrode layer 41 (WLDD0).

As described above, in the first embodiment, in the second end region 102 far from the connection node with the word line driving circuit (not shown), the charging/discharging can be performed from the String with a fast "rising/falling time" toward the String with a slow "rising/falling time". For this reason, as compared with the reference example, the delay difference between the "rising/falling time" in the String0 and the "rising/falling time" in the String1 can be reduced. Therefore, as compared with the reference example, the first embodiment has an advantage of improving the performance of the semiconductor device, for example, increasing the speed of the operation.

Figure 9A:
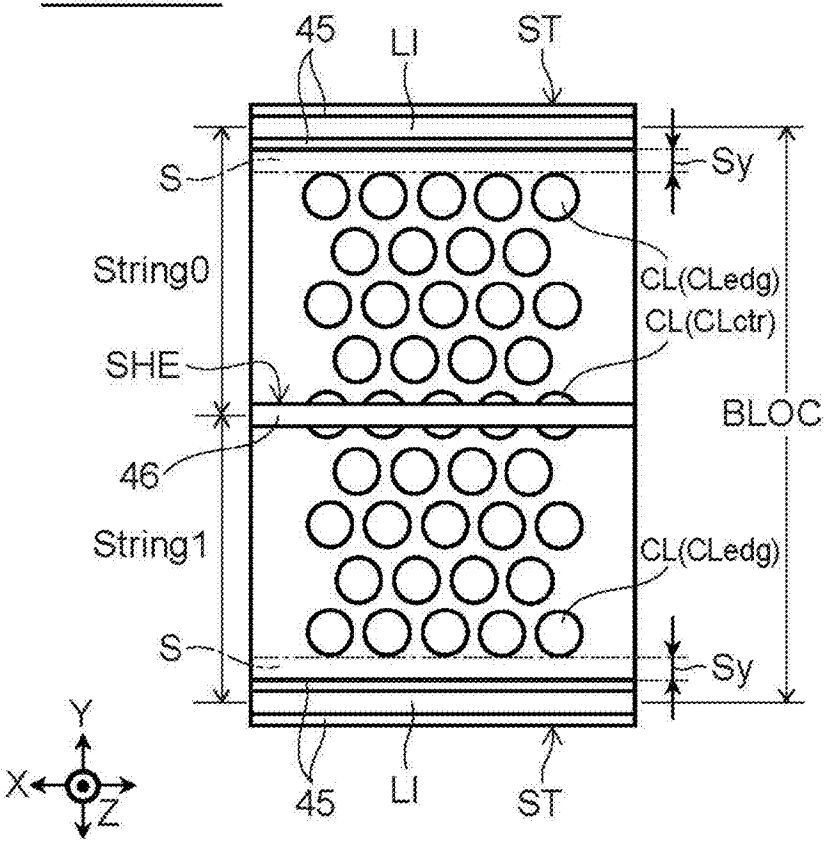
FIGS. 9A and 9B are schematic plan views of a semiconductor device of another reference example.
Figure 9B:
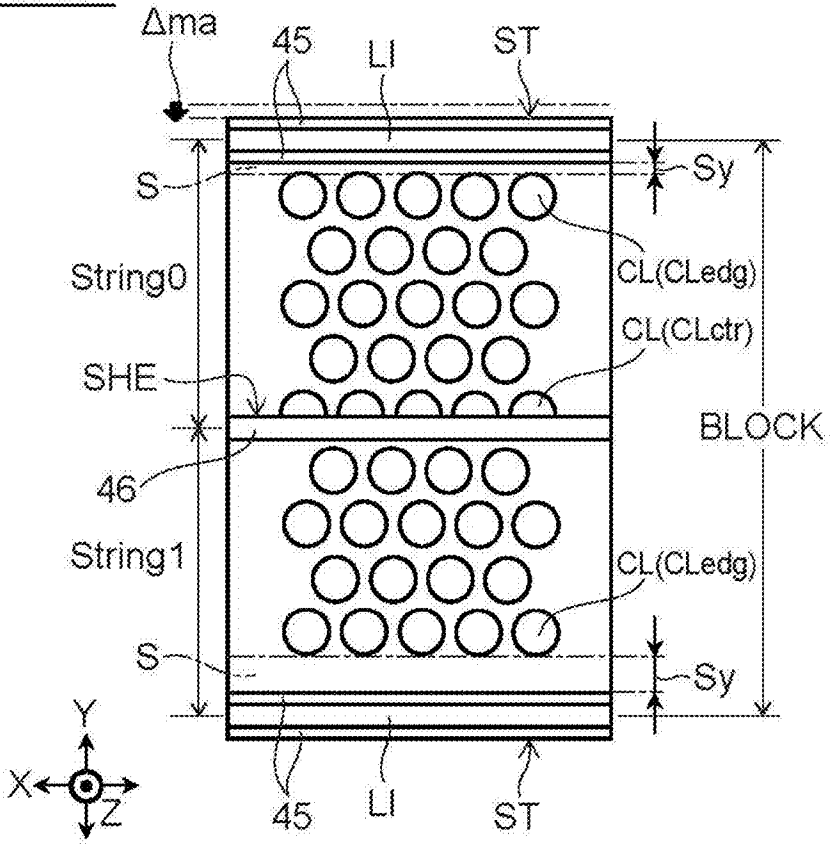

FIGS. 9A and 9B are schematic plan views of a semiconductor device of another reference example. Another reference example is an example in which, for example, after forming the column-shaped portion CL in the stacked body 100, the first slit ST is formed in the stacked body 100.

As shown in FIGS. 9A and 9B, the resistance of the electrode layer 41 depends on the width Sy of a region S in the Y-direction, for example, between the first slit ST and a column-shaped portion CLedg closer to the first slit ST. No column-shaped portion CL is provided to the region S. For this reason, it is easy to keep the resistance of the region S low.

FIG. 9A shows a case where there is no "misalignment" of the photomask between the column-shaped portion CL and the first slit ST. In this case, the width Sy is equal in both the String0 and the String1. For this reason, the resistance of the region S is equal in both the String0 and the String1. Therefore, there is no difference between the charging/discharging time of the electrode layer 41 (WLDD0) on the String0 side and the charging/discharging time of the electrode layer 41 (WLDD0) on the String1 side.

FIG. 9B shows a case where "misalignment" of the photomask occurs between the column-shaped portion CL and the first slit ST. In another reference example shown in FIG. 9B, for example, the photomask used for forming the first slit ST is shifted by "Δma" in the Y-direction. In this case, the width Sy is, for example, narrow in the String0 and is wide in the String1. For this reason, the resistance of the region S is high in the String0 and is low in the String1. Therefore, as in the reference example shown in FIG. 8, a difference occurs between the charging/discharging time of the electrode layer 41 (WLDD0) on the String0 side and the charging/discharging time of the electrode layer 41 (WLDD0) on the String1 side. The difference in charging/discharging time becomes a delay difference between the "rising/falling time" of the electrode layer 41 (WLDD0) in the String0 and the "rising/falling time" of the electrode layer 41 (WLDD0) in the String1.

Such a delay difference is remarkably likely to occur in the semiconductor device in which the second slit SHE is provided to overlap, for example, a column-shaped portion CLctr disposed at the center of the BLOCK in the Y-direction. This is because the region in which there is no column-shaped portion CL like the region S is not between the second slit SHE and the column-shaped portion CL.

For another reference example, in the first embodiment, as shown in FIGS. 6 and 7, the electrode layer 41 (WLDD0) remains connected, for example, in both the first end region 101 and the second end region 102. Therefore, even if the resistance of the region S is different between the String0 and the String1, as compared with another reference example, the delay difference between the "rising/falling time" in the String0 and the "rising/falling time" in the String1 can be reduced. Therefore, as compared with another reference example, the first embodiment has an advantage of improving the performance of the semiconductor device, for example, increasing the speed of the operation.

Figure 10:
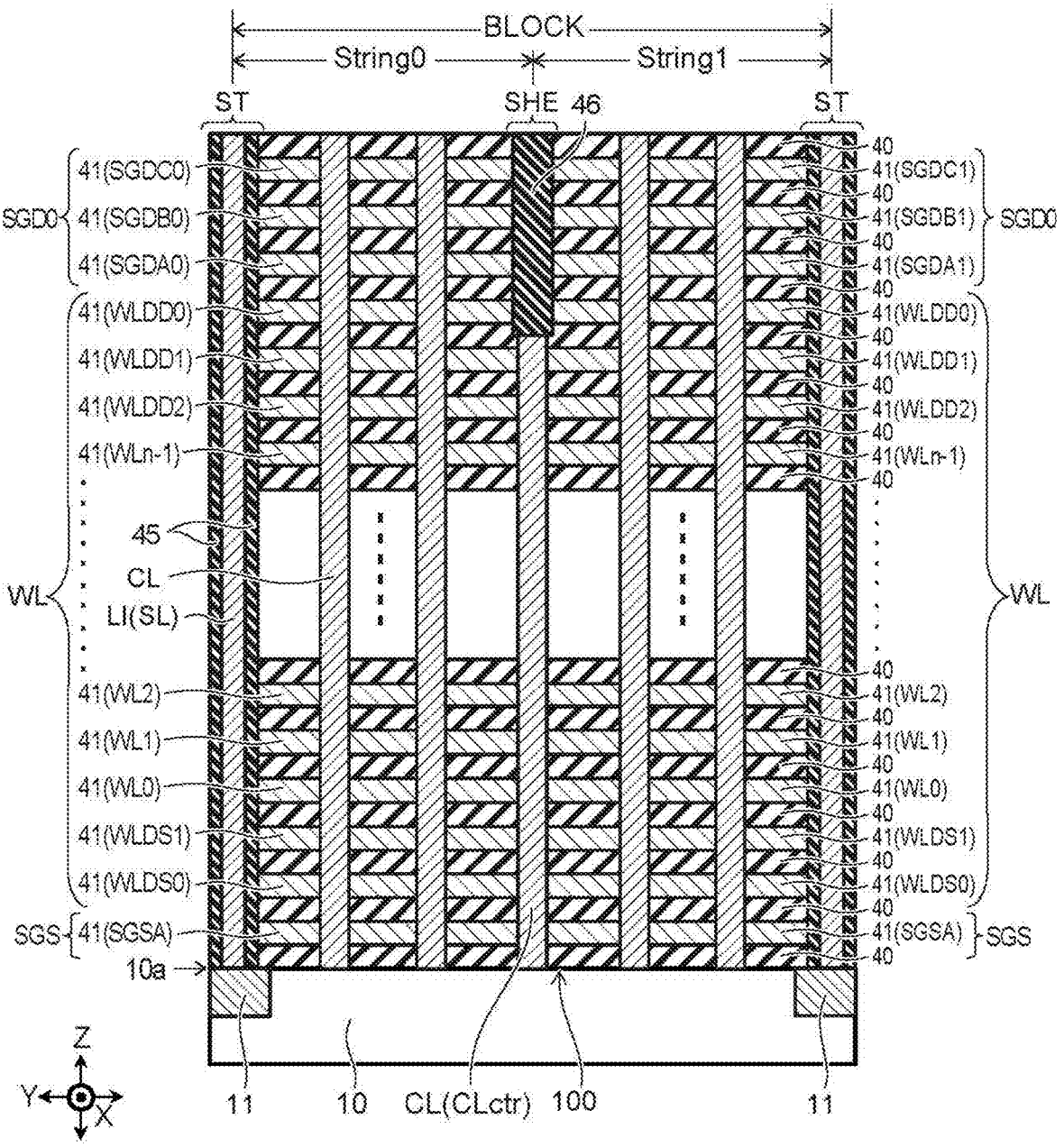
FIG. 10 is a schematic cross-sectional view showing a variation of the first embodiment.

FIG. 10 is a schematic cross-sectional view showing a variation of the first embodiment. The cross section shown in FIG. 10 corresponds to, for example, the cross section shown in FIG. 4.

As shown in FIG. 10, the variation is different from the first embodiment shown in FIG. 4, for example, in that the second slit SHE is provided to overlap the column-shaped portion CL. The second slit SHE is provided in the column-shaped portion CL, for example, on the column-shaped portion CLctr disposed at the center in the Y-direction of the BLOCK.

For example, as described with reference to FIG. 9, in a case where the second slit SHE is provided to overlap the column-shaped portion CL, if the "misalignment" of the photomask occurs between the column-shaped portion CL and the first slit ST, the delay difference between the "rising/falling time" in the String0 and the "rising/falling time" in the String1 is easily increased.

However, in the first embodiment, the electrode layer 41 (WLDD0) is maintained to be connected to, for example, both the first end region 101 and the second end region 102. For this reason, it is possible to reduce the delay difference between the "rising/falling time" in the String0 and the "rising/falling time" in the String1.

Therefore, the first embodiment can be more effectively applied to the semiconductor device in which the second slit SHE is provided to overlap the column-shaped portion CL as shown in FIG. 10. The variation shown in FIG. 10 can also be applied to all the embodiments described below.

Second Embodiment

<Semiconductor Device>

Figure 11:
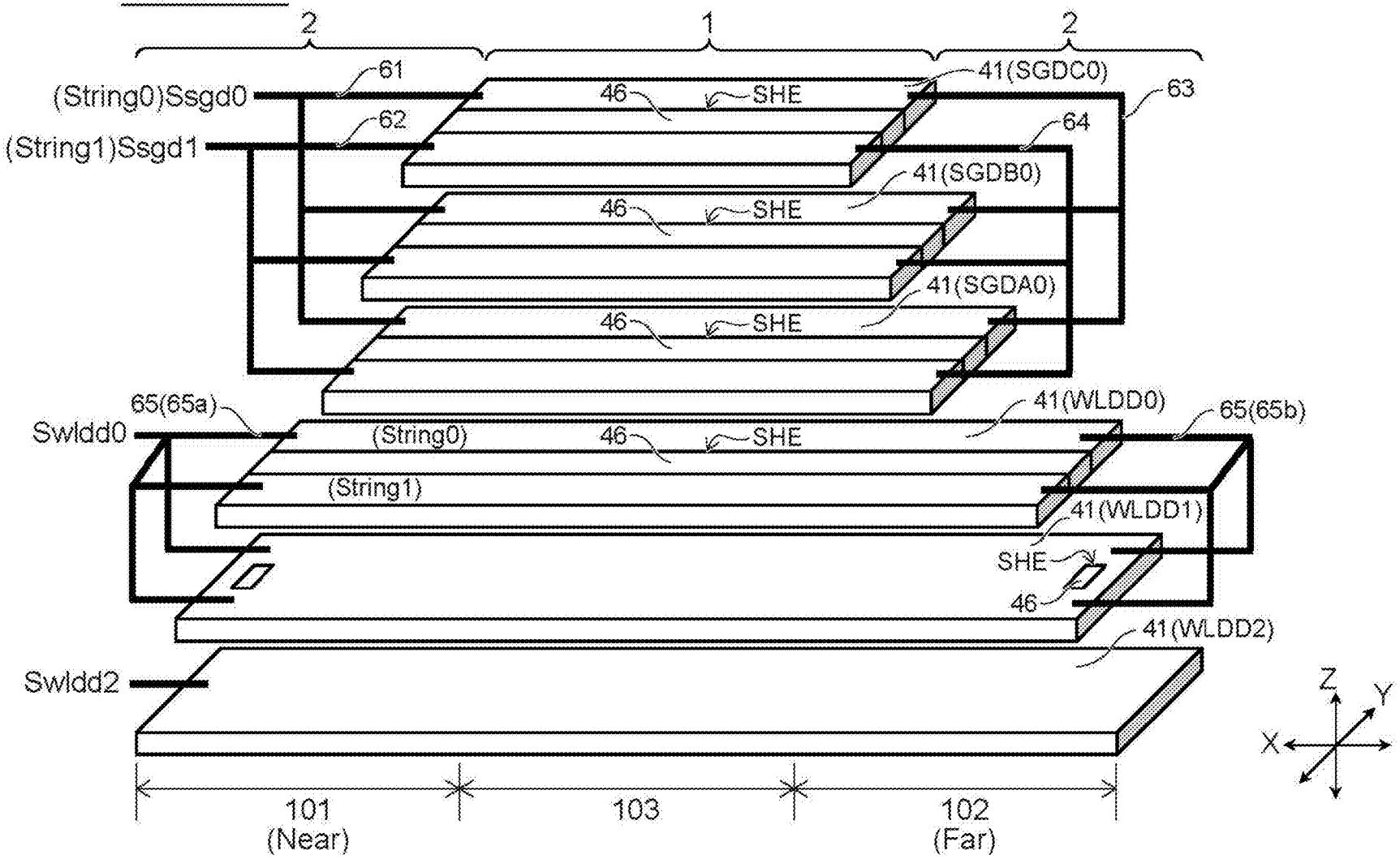
FIG. 11 is a schematic perspective view of a semiconductor device of a second embodiment.

FIG. 11 is a schematic perspective view of a semiconductor device of a second embodiment. The portion shown in FIG. 11 corresponds to the portion shown in FIG. 6.

As shown in FIG. 11, the second embodiment is different from the first embodiment shown in, for example, FIG. 6 in that a fifth interconnection 65 is provided. The fifth interconnection 65 electrically connects the electrode layer 41 (WLDD0) and the electrode layer 41 (WLDD1). The signal Swldd from the word line driving circuit (not shown) is supplied to the fifth interconnection 65.

The fifth interconnection 65 is provided above at least one of the first end region 101 and the second end region 102. In the second embodiment, the fifth interconnection 65 includes a fifth interconnection 65a provided above the first end region 101 and a fifth interconnection 65b provided above the second end region 101.

According to the second embodiment, the fifth interconnection 65 electrically connects the electrode layer 41 (WLDD0) and the electrode layer 41 (WLDD1). For this reason, even if the electrode layer 41 (WLDD0) is divided by the second insulating layer 46, similarly to the first embodiment, the delay difference between the "rising/falling time" in the String0 and the "rising/falling time" in the String1 can be reduced.

In this manner, the fifth interconnection 65 for electrically connecting the electrode layer 41 (WLDD0) and the electrode layer 41 (WLDD1) may be provided above at least one of the first end region 101 and the second end region 102.

Furthermore, in the second embodiment, the electrode layer 41 (WLDD0) and the electrode layer 41 (WLDD1) are electrically connected to each other by the fifth interconnection 65. For this reason, for example, similarly to the reference example shown in FIG. 8, the electrode layer 41 (WLDD0) may be divided by the second insulating layer 46.

<Example of Planar Pattern of Fifth Interconnection 65>

Figure 12:
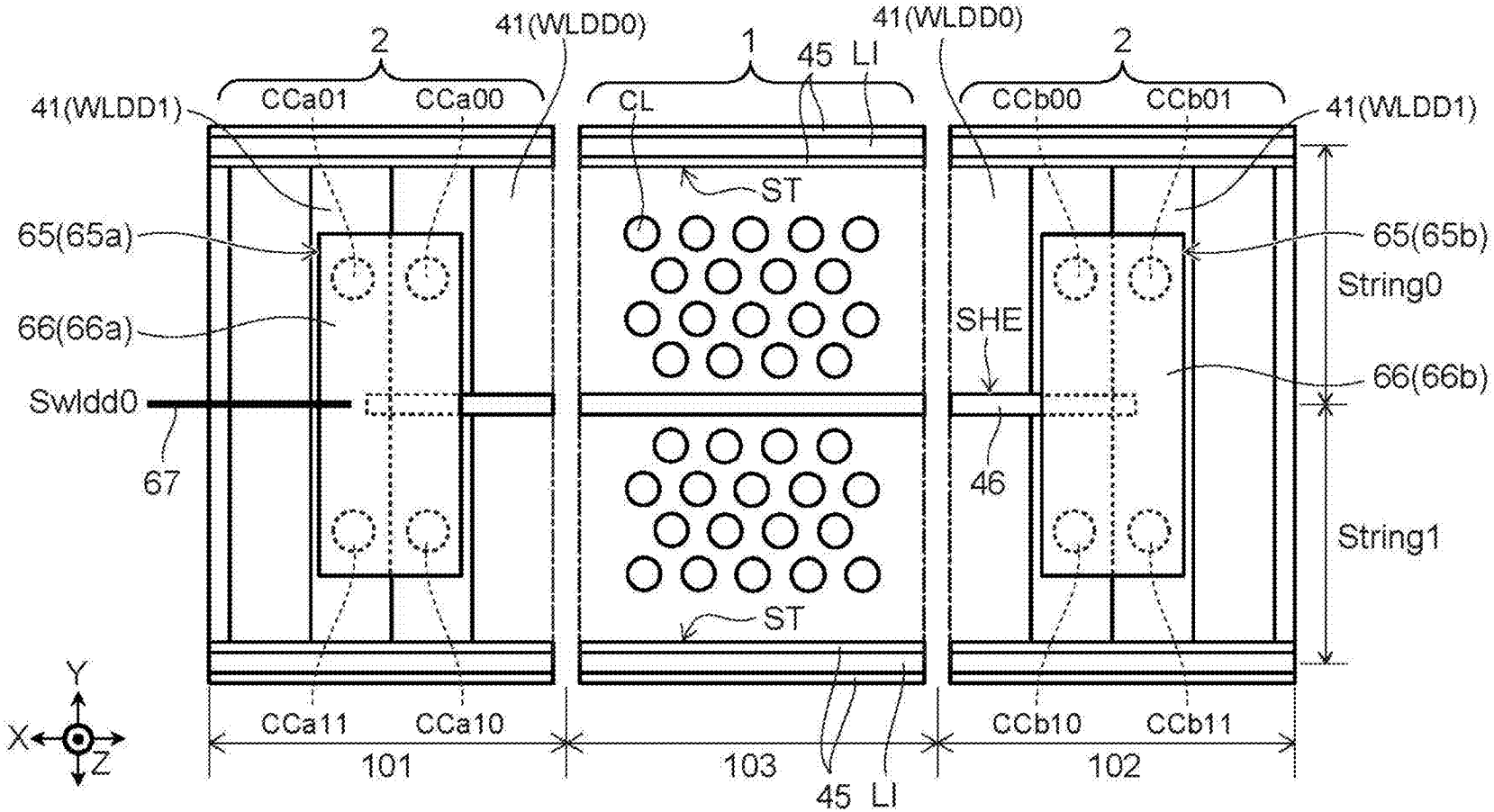
FIG. 12 is a schematic plan view of the semiconductor device of the second embodiment.

FIG. 12 is a schematic plan view of the semiconductor device of the second embodiment. The plane shown in FIG. 12 corresponds to the plane shown in FIG. 7. FIG. 12 shows one example of the planar pattern of the fifth interconnection 65.

The fifth interconnection 65a includes, for example, contacts CCa00 to CCa11. The contacts CCa00 to CCa11 extend in the Z-direction. The contacts CCa00 and CCa01 belong to String0. The contacts CCa10 and CCa11 belong to String1.

The fifth interconnection 65b includes, for example, contacts CCb00 to CCb11. The contacts CCb00 to CCb11 have, for example, the same structure as the contacts CCa00 to CCa11. Each of the contacts CCa00 to CCb11 contains a conductive material. An example of the conductive material is W.

The contact CCa00 is electrically connected to the String0 side of the electrode layer 41 (WLDD0) in the first end region 101. Similarly, the contact CCa01 is electrically connected to the electrode layer 41 (WLDD1). The contact CCa10 is electrically connected to the String1 side of the electrode layer 41 (WLDD0). The contact CCa11 is electrically connected to the electrode layer 41 (WLDD1).

The contact CCb00 is electrically connected to the String0 side of the electrode layer 41 (WLDD0) in the second end region 102. Similarly, the contact CCb01 is electrically connected to the electrode layer 41 (WLDD1). The contact CCb10 is electrically connected to the String1 side of the electrode layer 41 (WLDD0). The contact CCb11 is electrically connected to the electrode layer 41 (WLDD1).

A sixth interconnection 66 is provided above the contacts CCa00 to CCb11. The second embodiment includes sixth interconnections 66a and 66b. The sixth interconnection 66a is electrically connected to the contacts CCa00 to CCa11 above the first end region 101. The sixth interconnection 66b is electrically connected to the contacts CCb00 to CCb11 above the second end region 102.

The signal Swldd is supplied from the word line driving circuit (not shown) to the sixth interconnection 66a via a seventh interconnection 67. The seventh interconnection 67 is provided, for example, above the sixth interconnection 66a.

In the case of implementing the semiconductor device of the second embodiment, for example, a planar pattern as shown in FIG. 12 may be used.

Third Embodiment

<Semiconductor Device>

Figure 13:
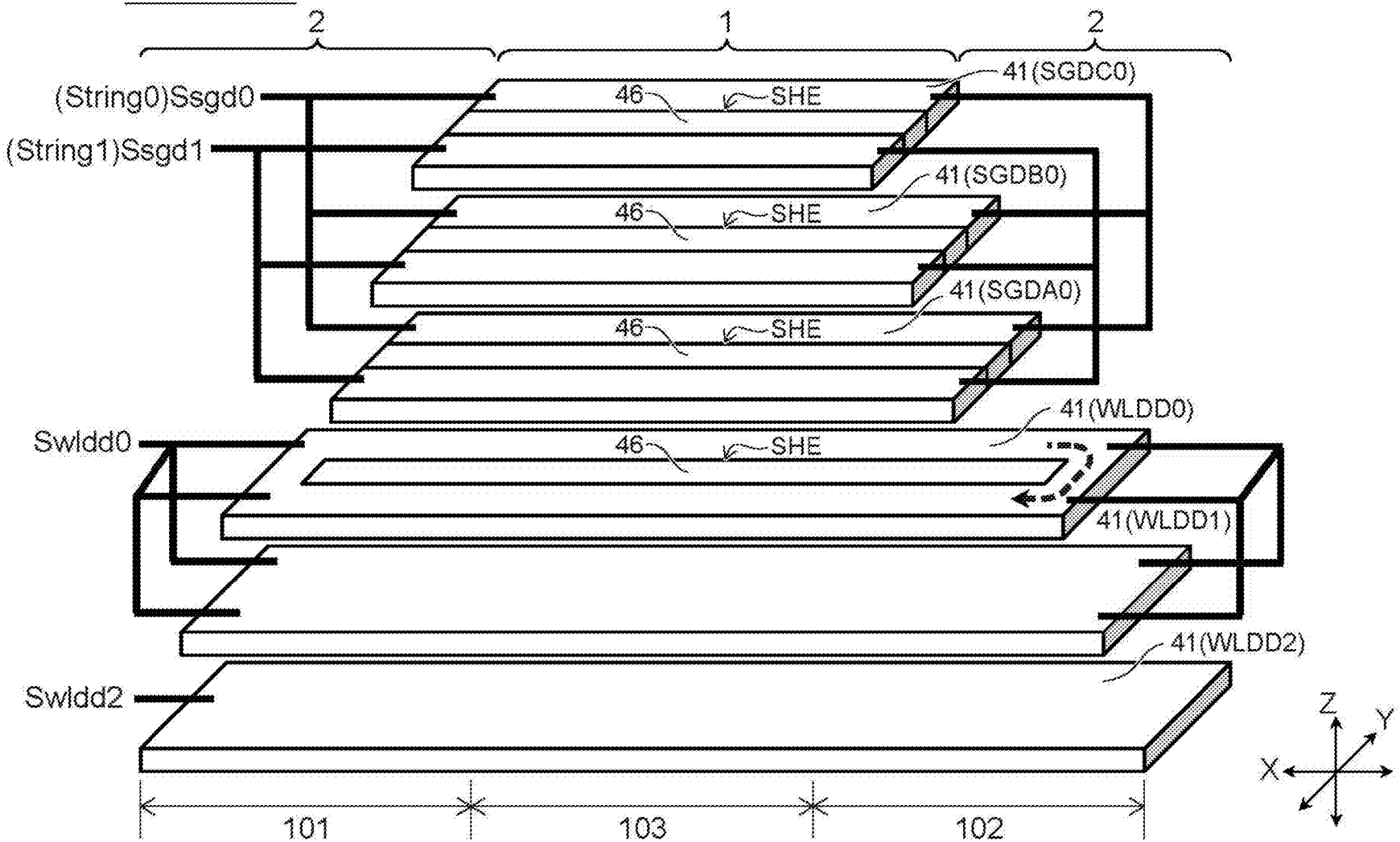
FIG. 13 is a schematic perspective view of a semiconductor device according to a third embodiment.

FIG. 13 is a schematic perspective view of a semiconductor device according to a third embodiment. The portion shown in FIG. 13 corresponds to the portion shown in FIG. 6.

As shown in FIG. 13, the third embodiment is an example of a combination of, for example, the second embodiment shown in FIG. 11 and the first embodiment shown in FIG. 6.

Similarly to the third embodiment, the second embodiment may be combined with the first embodiment.

Fourth Embodiment

<Semiconductor Device>

Figure 14:
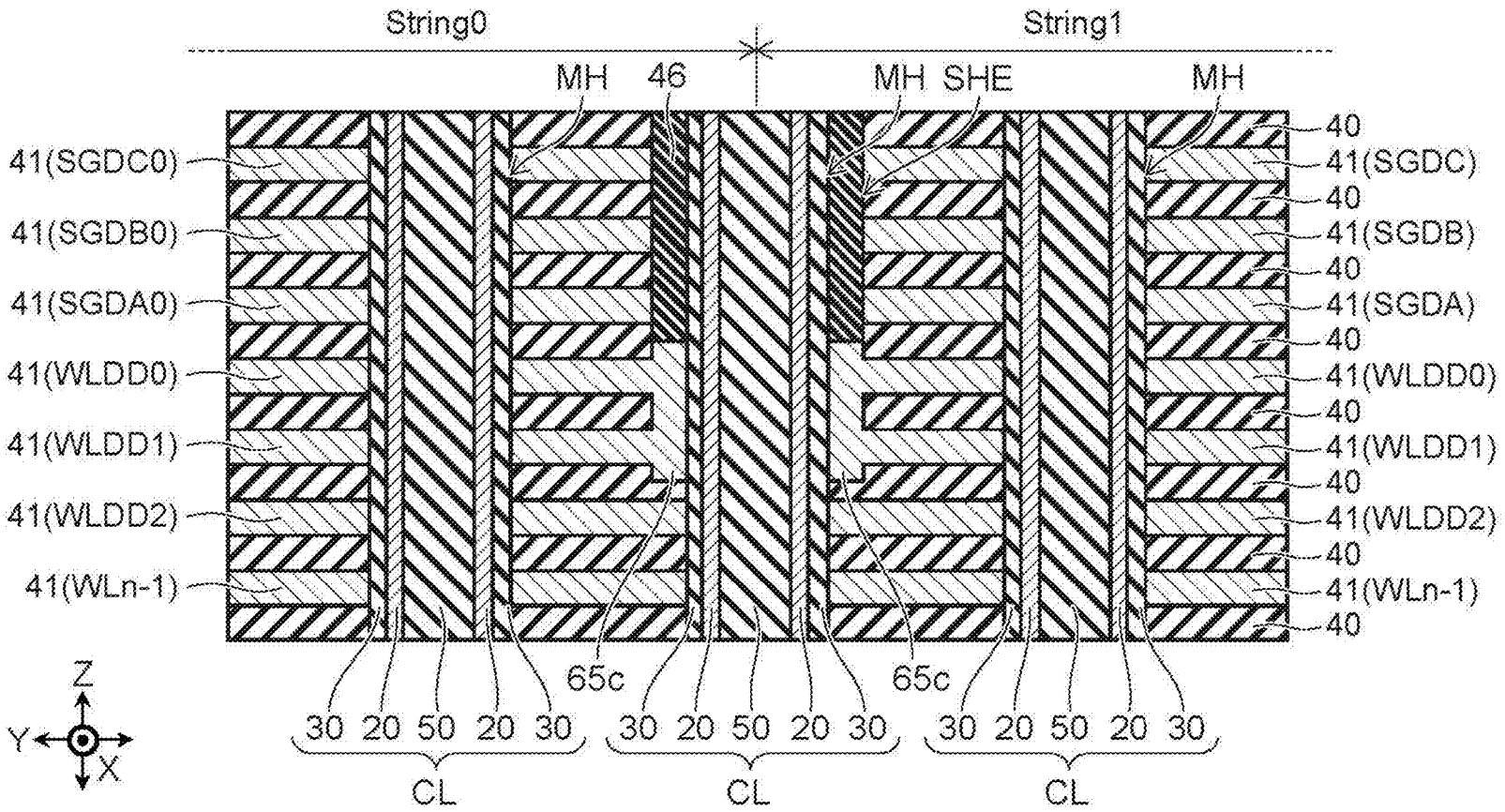
FIG. 14 is a schematic cross-sectional view of a semiconductor device of a fourth embodiment.

FIG. 14 is a schematic cross-sectional view of a semiconductor device of a fourth embodiment. The cross section shown in FIG. 14 corresponds to the cross section shown in FIG. 4. FIG. 14 is an enlarged view of the upper layer portion of the stacked body 100 around the second slit ST.

As shown in FIG. 14, for example, the fourth embodiment is different from the second embodiment shown in FIG. 11 in that a fifth interconnection 65c for electrically connecting the electrode layer 41 (WLDD0) and the electrode layer 41 (WLDD1) is provided in the stacked body 100. The fifth interconnection 65c is provided below the second insulating layer 46. The fifth interconnection 65c is provided, for example, in the second slit SHE and extends in the Z-direction. In the embodiment, the fifth interconnection 65c is along the column-shaped portion CL. The column-shaped portion CL is, for example, a dummy column-shaped portion CLshe provided to penetrate the second slit SHE.

In the fourth embodiment, the column-shaped portion CLshe is also provided in the second insulating layer 46. The column-shaped portion CLshe has the same structure as the other column-shaped portion CL. The column-shaped portion CLshe is provided at the same position as, for example, the column-shaped portion CLctr shown in FIGS. 9 and 10. The fifth interconnection 65c is provided along the column-shaped portion CLshe. However, the structure shown in FIG. 14 is one example, and the fourth embodiment is not limited to the structure shown in FIG. 14. The fifth interconnection 65c may be provided in the stacked body 100 and may be electrically connected to the electrode layer 41 (WLDD0) and the electrode layer 41 (WLDD1).

<Manufacturing Method>

Figure 15A:
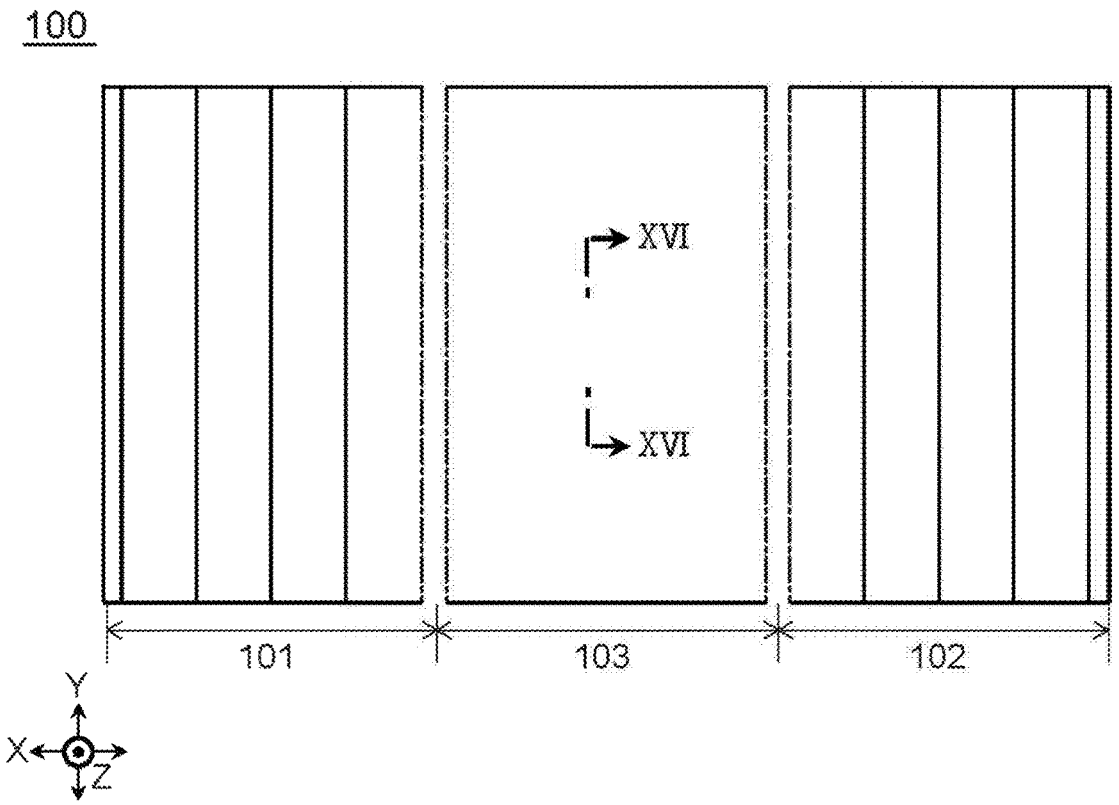
FIGS. 15A and 15B are schematic plan views showing a method of manufacturing the semiconductor device of the fourth embodiment.
Figure 15B:
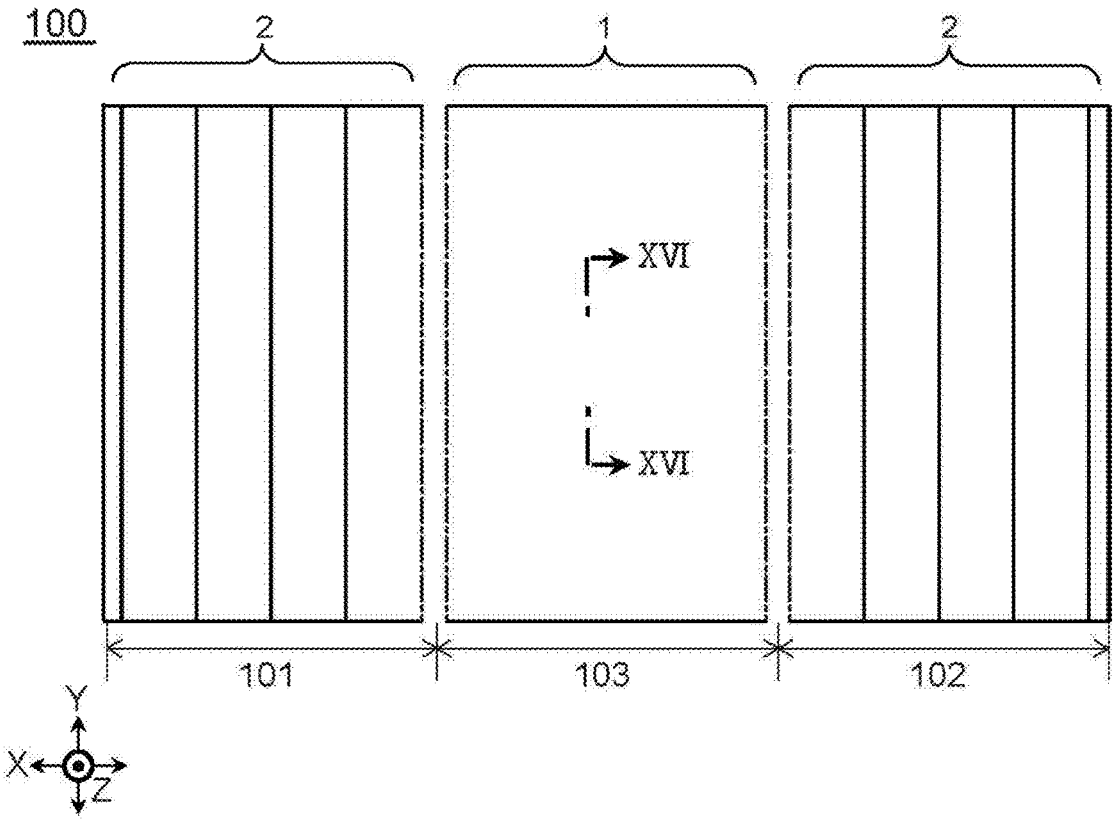

FIGS. 15A and 15B are schematic plan views showing a method of manufacturing the semiconductor device of the fourth embodiment. The planes shown in FIGS. 15A and 15B correspond to the planes shown in FIG. 1. FIGS. 16A to 16H are schematic cross-sectional views showing the method of manufacturing the semiconductor device of the fourth embodiment. The cross sections shown in FIGS. 16A to 16H correspond to the cross section along line XVI-XVI in FIGS. 15A and 15B. FIG. 15A to FIG. 16H show one example of the method of manufacturing the semiconductor device of the fourth embodiment.

1. Formation of Stacked Body 100

Figures 16A, 16B, 16C, 16D, 16E, 16F, 16G, 16H:
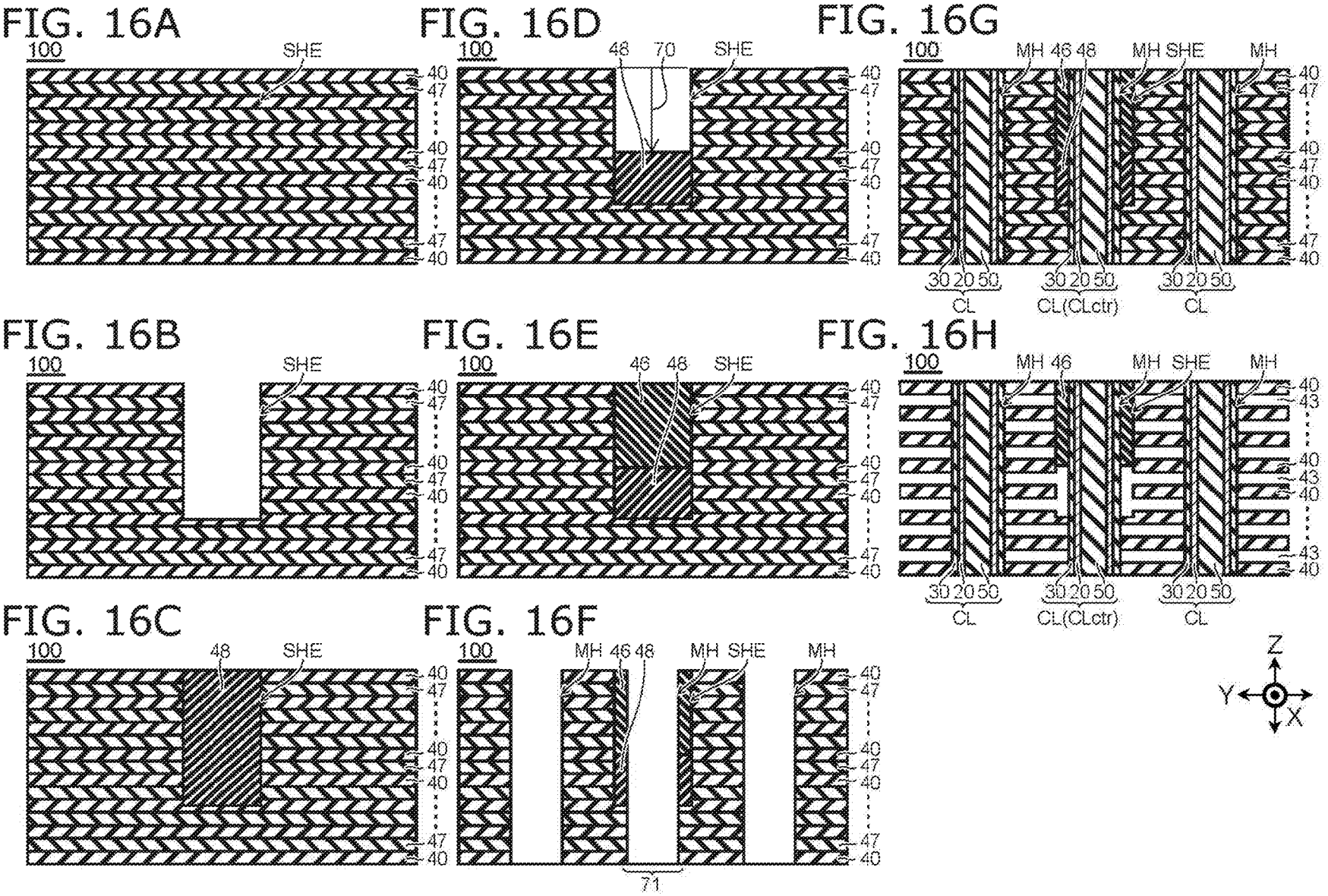
FIGS. 16A to 16H are schematic cross-sectional views showing the method of manufacturing the semiconductor device of the fourth embodiment.

As shown in FIG. 15A and FIG. 16A, the stacked body 100 is formed on the substrate 10 (not shown in FIG. 15A and FIG. 16A). The stacked body 100 is formed by alternately stacking the insulators 40 and first sacrificial layers 47 in the Z-direction. The material of which etching selection ratio of each other can be obtained is selected for the insulator 40 and the first sacrificial layer 47. For example, in a case where silicon oxide is selected for the insulator 40, for example, silicon nitride is selected for the first sacrificial layer 47.

2. Formation of Staircase Portion 2

As shown in FIG. 15B, the staircase portion 2 is formed in the first end region 101 and the second end region 102. The staircase portion 2 is formed by a well-known method such as "resist slimming method". Accordingly, the staircase portion 2 and the memory cell array 1 are obtained in the stacked body 100.

3. Formation of Second Slit SHE

As shown in FIG. 16B, the second slit SHE is formed in the stacked body 100. The second slit SHE is formed in the stacked body 100 by, for example, anisotropic etching by using a photoresist as a mask. In the embodiment, the second slit SHE is formed so as to reach, for example, the first sacrificial layer 47 which is to be replaced with the WLDD1.

4. Formation of Second Sacrificial Layer 48

As shown in FIG. 16C, a second sacrificial layer 48 is formed on the stacked body 100. For example, the same material as the first sacrificial layer 47 is selected as the material of the second sacrificial layer 48. For example, in a case where the first sacrificial layer 47 is silicon nitride, the silicon nitride is selected for the second sacrificial layer 48. The thickness of the second sacrificial layer 48 is set to a level that allows the second slit SHE to be buried. Next, the second sacrificial layer 48 is, for example, etched back, and the second slit SHE is buried by the second sacrificial layer 48.

5. Recess of Second Sacrificial Layer 48

As shown in FIG. 16D, the second sacrificial layer 48 is recessed. The second sacrificial layer 48 remains to bury the first sacrificial layer 47 which is to be replaced with, for example, the WLDD0 and the WLDD1 in the second slit SHE. Reference numeral 70 indicates a portion where the second sacrificial layer 48 is recessed.

6. Formation of Second Insulating Layer 46

As shown in FIG. 16E, the second insulating layer 46 is formed on the stacked body 100. For example, the same material as the insulator 40 is selected as the material of the second insulating layer 46. For example, in a case where the insulator 40 is silicon oxide, the silicon oxide is selected for the second insulating layer 46. The thickness of the second insulating layer 46 is set to a level that allows the recessed portion 70 to be buried. Next, the second insulating layer 46 is, for example, etched back, and the recessed portion 70 is buried by the second insulating layer 46.

7. Formation of Memory Hole MH

As shown in FIG. 16F, the memory hole MH is formed in the stacked body 100. The memory hole MH is formed in the stacked body 100 by, for example, anisotropic etching by using a photoresist as a mask. The memory hole MH is formed to penetrate the stacked body 100 and to reach the substrate 10 (not shown). In the embodiment, the memory hole MH is also formed in a portion 71 where the second slit SHE is formed. In the portion 71, the memory hole MH penetrates the second insulating layer 46 and the second sacrificial layer 48.

8. Formation of Column-Shaped Portion CL

As shown in FIG. 16G, the column-shaped portion CL is formed in the memory hole MH. By the column-shaped portion CL, for example, the memory film 30 is formed on the stacked body 100. Next, the portion of the memory film 30 on the bottom (not shown) of the memory hole MH is removed, and thus, the substrate 10 (not shown) is exposed from the bottom of the memory hole MH. Next, the semiconductor body 20 is formed on the memory film 30. Next, the core layer 50 is formed on the semiconductor body 20. The core layer 50 buries the memory hole MH in which the memory film 30 and the semiconductor body 20 are formed.

9. Removal of First Sacrificial Layer 47 and Second Sacrificial Layer 48 (Replacement Staircase)

As shown in FIG. 16H, the first slit ST (not shown) is formed in the stacked body 100. Next, the first sacrificial layer 47 and the second sacrificial layer 48 are removed via the first slit ST. Accordingly, a space 43 is formed between the insulators 40. In the embodiment, the space 43 is also formed in a portion under a second insulating layer 46b. The space 43 formed under the second insulating layer 46b is formed to range over the space 43 existing along the column-shaped portion CL in the Z-direction via the insulator 40.

10. Burying of Electrode Layer 41 (Replacement Process)

As shown in FIG. 14, the space 43 is buried by the electrode layer 41. Accordingly, the electrode layer 41 and the fifth interconnection 65c are formed in the stacked body 100.

The semiconductor device of the fourth embodiment may be manufactured, for example, by the manufacturing method shown in FIG. 15A to FIG. 16H.

Fifth Embodiment

<Semiconductor Device>

Figure 17:
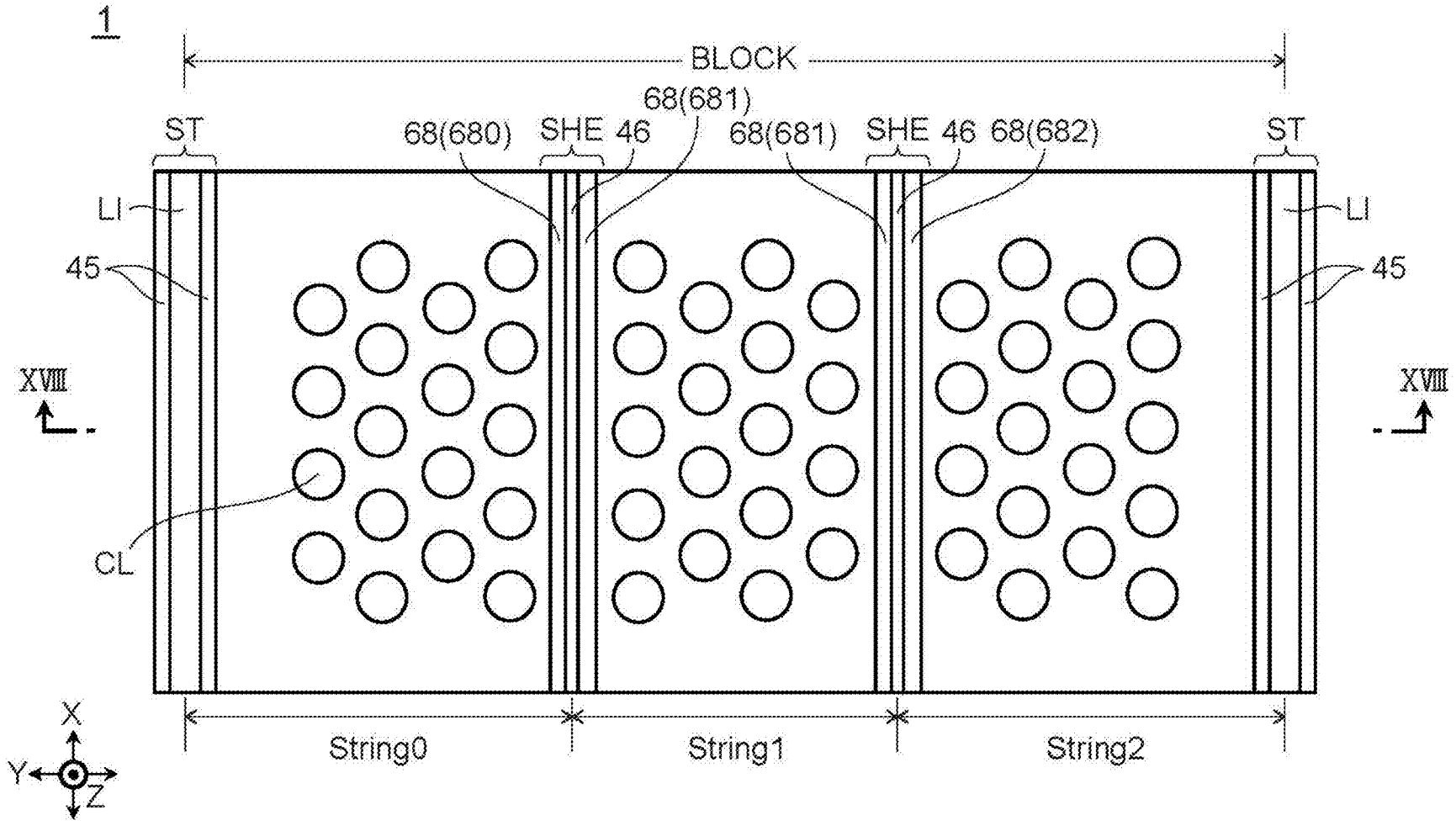
FIG. 17 is a schematic plan view of a semiconductor device of a fifth embodiment.
Figure 18:
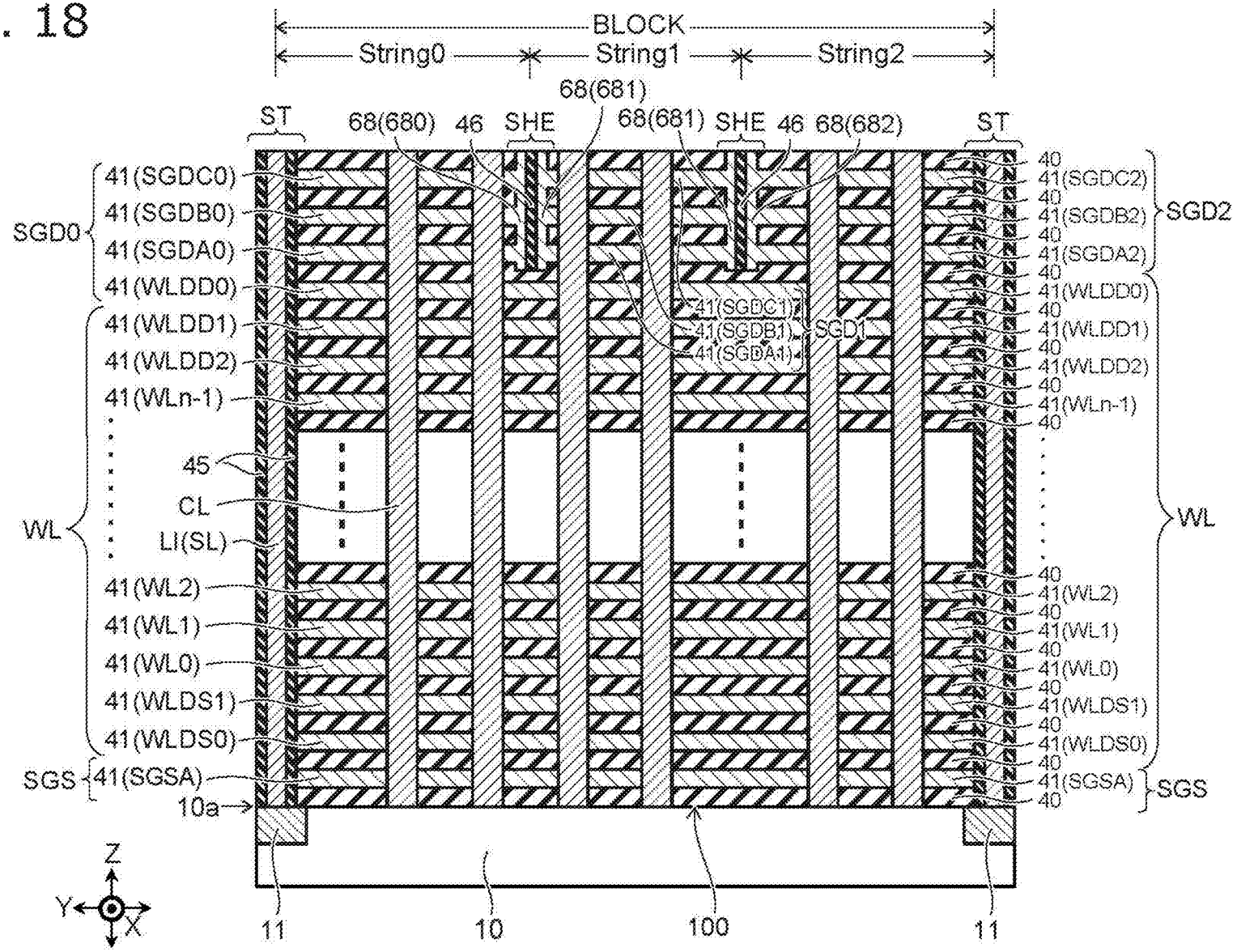
FIG. 18 is a schematic cross-sectional view taken along line XVIII-XVIII in FIG. 17.

FIG. 17 is a schematic plan view of a semiconductor device of a fifth embodiment. A plane shown in FIG. 17 corresponds to the plane shown in FIG. 3. FIG. 18 is a schematic cross-sectional view taken along line XVIII-XVIII in FIG. 17.

As shown in FIGS. 17 and 18, the fifth embodiment is different from, for example, the fourth embodiment shown in FIG. 14 in that an eighth interconnection 68 is provided. Similarly to the fifth interconnection 65c, the eighth interconnection 68 is provided in the stacked body 100 and extends in the Z-direction.

The eighth interconnection 68 is different from the fifth interconnection 65c of the fourth embodiment in that the fifth interconnection 65c electrically connects the electrode layer 41 (WLDD0) and the electrode layer 41 (WLDD1) which are to be the dummy word line and the eighth interconnection 68 electrically connects the electrode layers 41 (SGDA) to 41 (SGDC) which are to be the drain-side selection gates. In the fifth embodiment, there are three types of eighth interconnections 680 to 682. The eighth interconnection 680 electrically connects the electrode layers 41 (SGDA0) to (SGDC0) belonging to the String0. The eighth interconnection 681 electrically connects the electrode layers 41 (SGDA1) to (SGDC1) belonging to the String1. The eighth interconnection 682 electrically connects the electrode layers 41 (SGDA2) to (SGDC 2) belonging to the String 2.

Similarly to the fifth interconnection 65c, the eighth interconnection 68 is provided in the second slit SHE. In the fourth embodiment, although the example in which the column-shaped portion CL is provided also in the second slit SHE is shown, in the fifth embodiment, the case where the column-shaped portion CL is not provided in the second slit SHE is shown.

According to the fifth embodiment, the electrode layers 41 (SGDA), 41 (SGDB), and 41 (SGDC) are electrically connected by the eighth interconnection 68. For this reason, the delay difference in the "rising/falling time" between the Strings can be reduced.

In the fifth embodiment, three Strings of the String0 to the String 2 are provided in one BLOCK. In the semiconductor device with the second slit SHE which stops in the middle of the stacked body 100, the number of Strings provided in one BLOCK is usually two. One reason why more than two Strings can be provided in one BLOCK is due to the manufacturing method described below.

<Manufacturing Method>

FIG. 19 to FIG. 30 are schematic cross-sectional views showing a method of manufacturing the semiconductor device of the fifth embodiment. The cross sections shown in FIG. 19 to FIG. 30 correspond to the cross sections shown in FIG. 18. FIG. 19 to FIG. 30 show one example of the method of manufacturing the semiconductor device of the fifth embodiment.

1. Formation of Stacked Body 100

Figure 19:
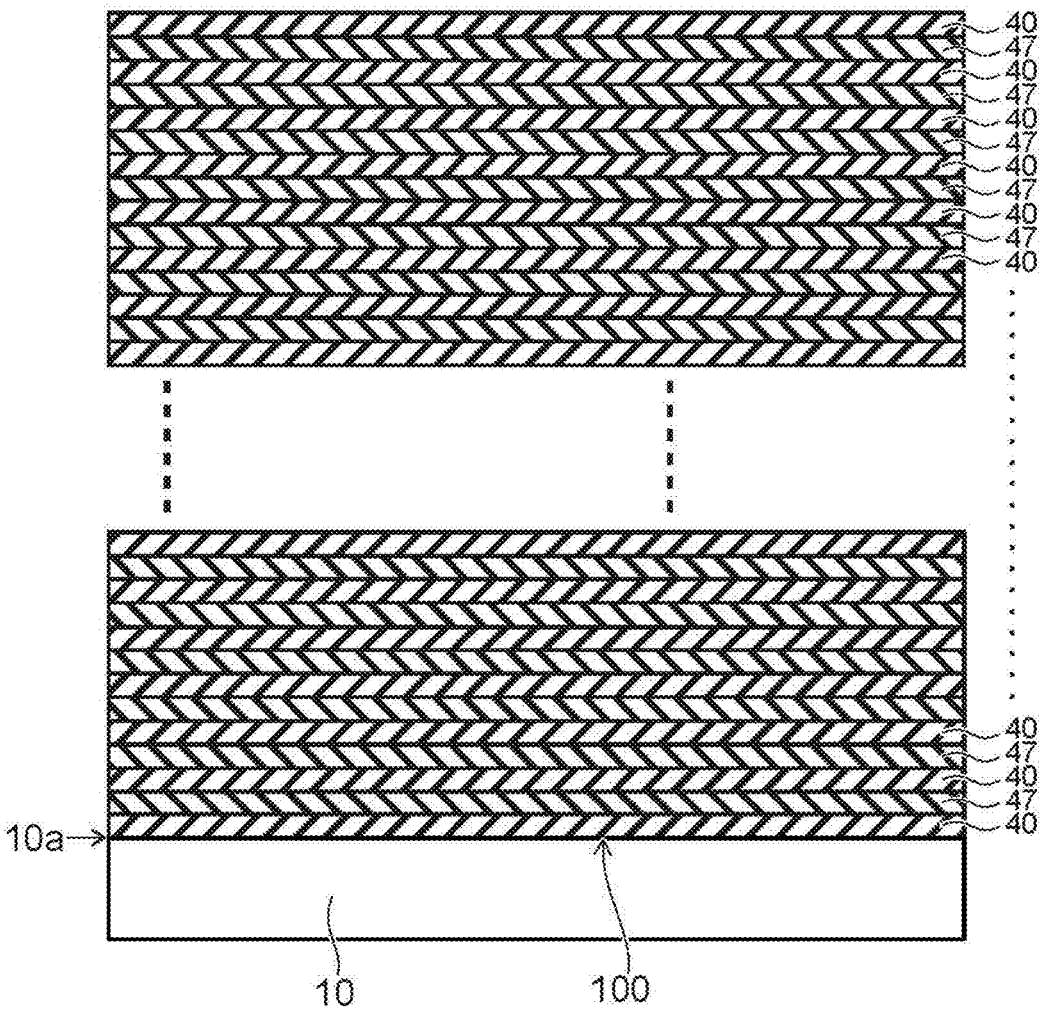
FIG. 19 is a schematic cross-sectional view showing a method of manufacturing the semiconductor device of the fifth embodiment.

As shown in FIG. 19, for example, the stacked body 100 is formed on the major surface 10a of the substrate 10 by the same method as the method described with reference to FIG. 15A and FIG. 16A.

2. Formation of Staircase Portion 2

Although not particularly shown, the staircase portion 2 is formed in the first end region 101 and the second end region 102 of the stacked body 100 by a method similar to, for example, the method described with reference to FIG. 15B.

3. Formation of Memory Hole MH

Figure 20:
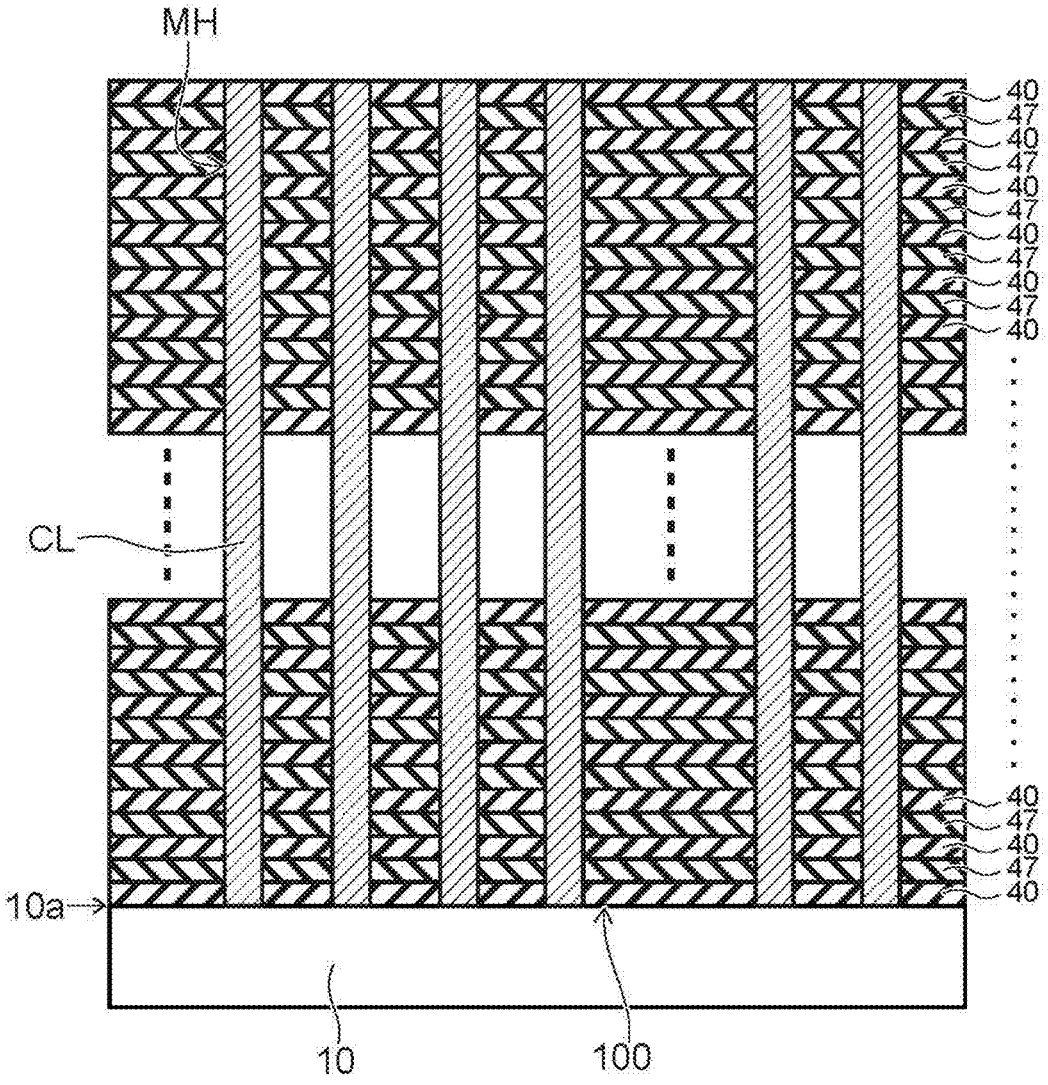
FIG. 20 is a schematic cross-sectional view showing a method of manufacturing the semiconductor device of the fifth embodiment.

As shown in FIG. 20, for example, the memory hole MH is formed in the stacked body 100 by a method similar to, for example, the method described with reference to FIG. 16F.

4. Formation of Column-Shaped Portion CL

Figure 21:
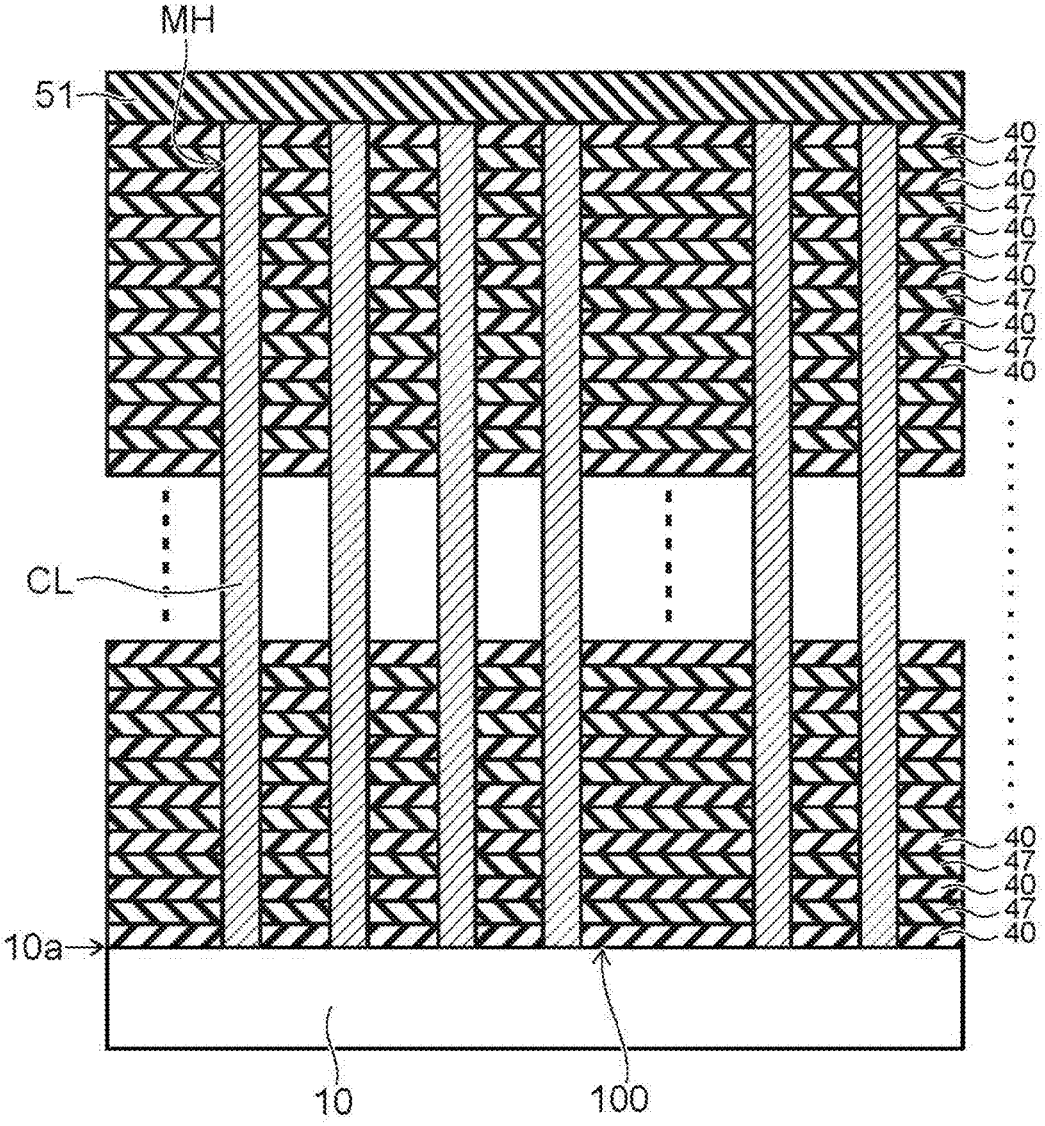
FIG. 21 is a schematic cross-sectional view showing a method of manufacturing the semiconductor device of the fifth embodiment.

As shown in FIG. 21, for example, the column-shaped portion CL is formed in the memory hole MH by a method similar to, for example, the method described with reference to FIG. 16G. Next, the third insulating layer 31 is formed on the stacked body 100 on which the column-shaped portion CL is formed. The third insulating layer 31 contains an insulating material. The insulating material is, for example, silicon oxide.

5. Formation of Second Slit SHE

Figure 22:
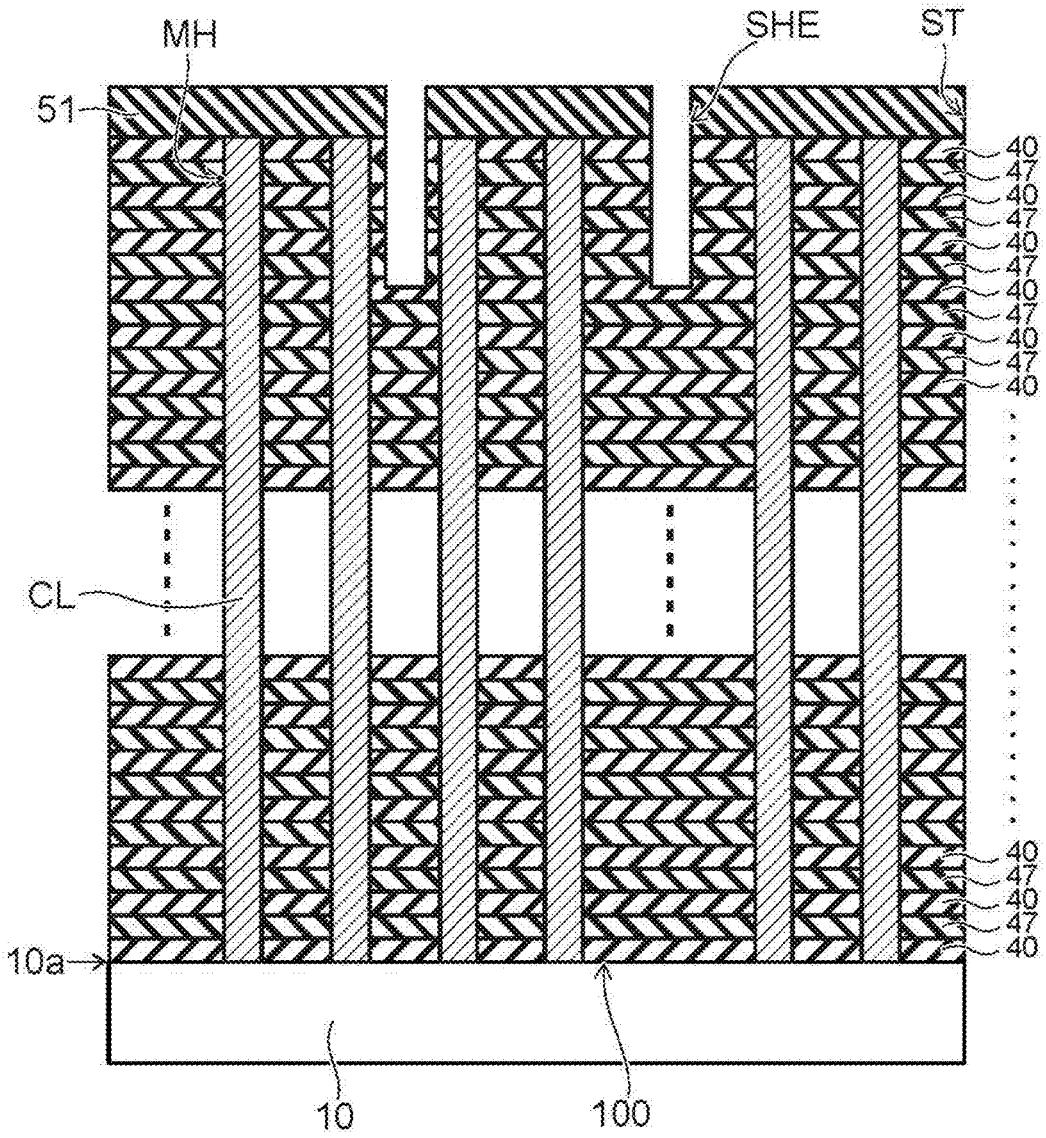
FIG. 22 is a schematic cross-sectional view showing a method of manufacturing the semiconductor device of the fifth embodiment.

As shown in FIG. 22, the second slit SHE is formed in the stacked body 100 by a method similar to, for example, the method described with reference to FIG. 16B. In the embodiment, the second slit SHE is formed so as to reach, for example, the first sacrificial layer 47 which is to be replaced with the SGDA.

6. Formation of Third Sacrificial Layer 49

Figure 23:
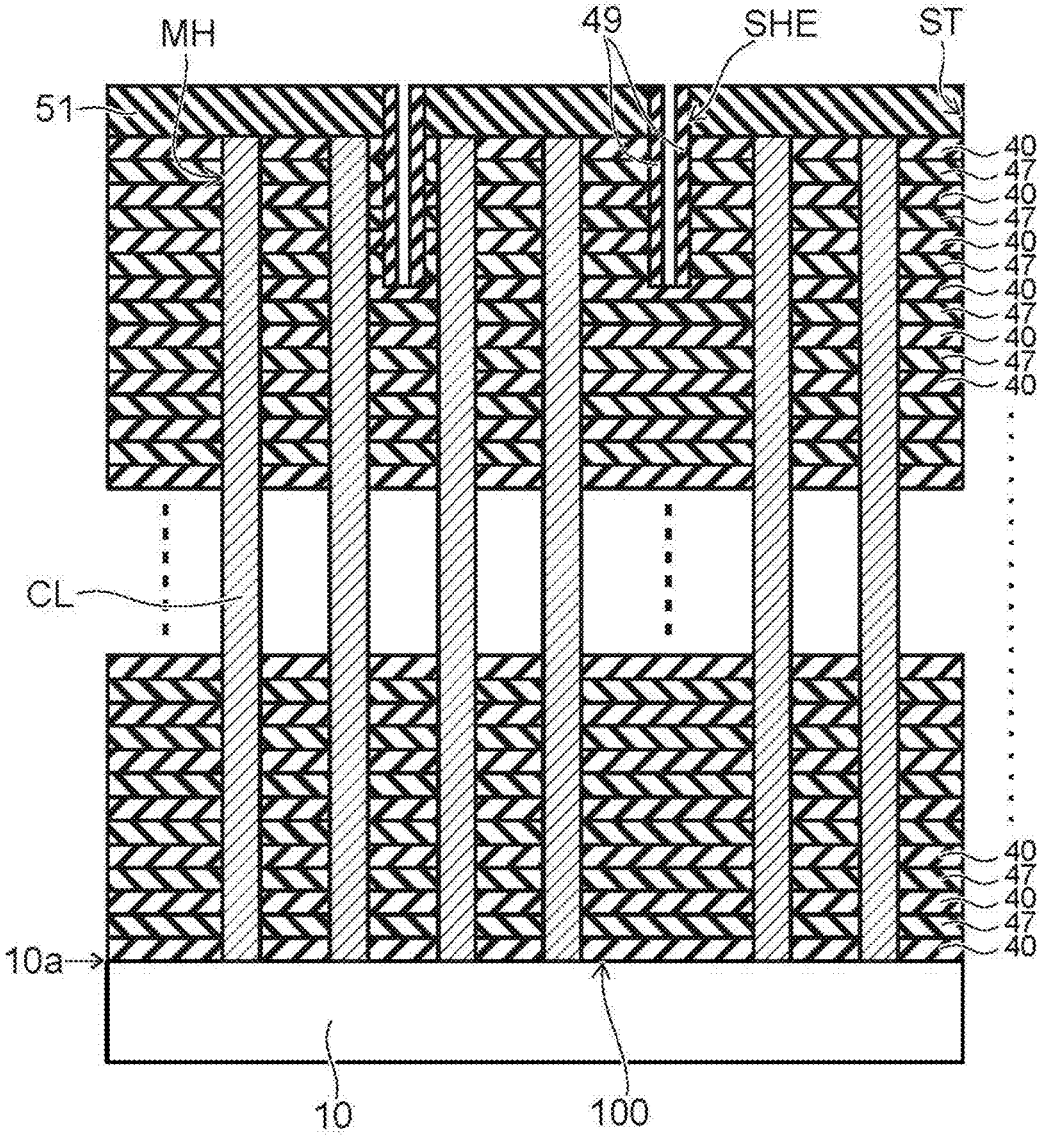
FIG. 23 is a schematic cross-sectional view showing a method of manufacturing the semiconductor device of the fifth embodiment.

As shown in FIG. 23, a third sacrificial layer 49 is formed on the side wall of the second slit SHE. For example, the same material as the first sacrificial layer 47 is selected as the material of the third sacrificial layer 49. For example, when the first sacrificial layer 47 is silicon nitride, the silicon nitride is selected for the third sacrificial layer 49.

7. Formation of Second Insulating Layer 46

Figure 24:
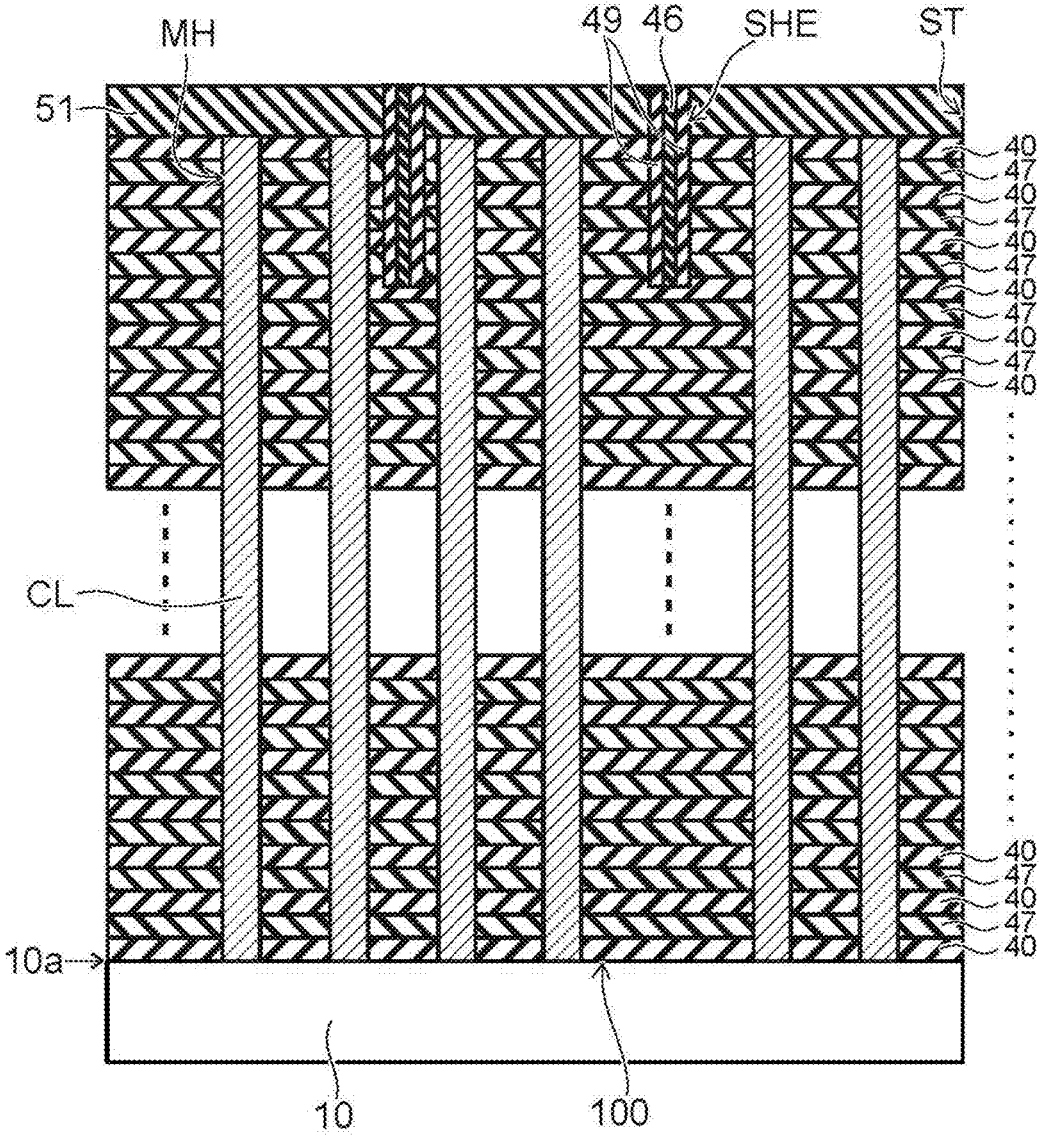
FIG. 24 is a schematic cross-sectional view showing a method of manufacturing the semiconductor device of the fifth embodiment.

As shown in FIG. 24, the second insulating layer 46 is formed in the second slit SHE formed with the third sacrificial layer 49. For example, the same material as the insulator 40 is selected as the material of the second insulating layer 46. For example, in a case where the insulator 40 is silicon oxide, the silicon oxide is selected for the second insulating layer 46.

8. Formation of First Slit ST

Figure 25:
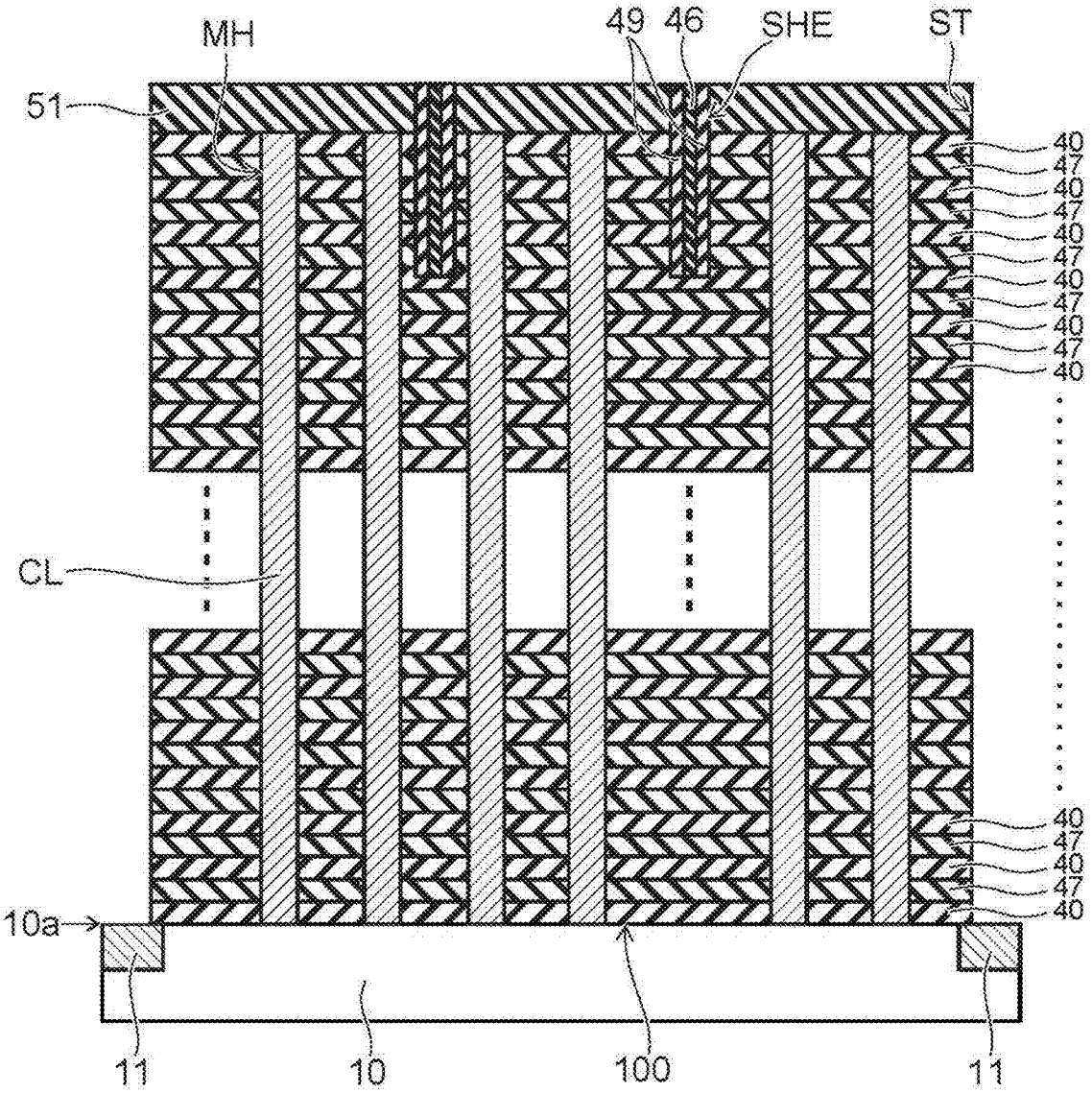
FIG. 25 is a schematic cross-sectional view showing a method of manufacturing the semiconductor device of the fifth embodiment.

As shown in FIG. 25, the first slit ST is formed in the stacked body 100. The first slit ST is formed so as to reach, for example, the substrate 10. Next, an impurity of a conductivity type different from that of the substrate 10, for example, an n-type impurity, is introduced into the substrate 10 via the first slit ST. Accordingly, the n-type semiconductor layer 11 is formed in the substrate 10.

9. Removal of First Sacrificial Layer 47 and Third Sacrificial Layer 49 (Replacement Process)

Figure 26:
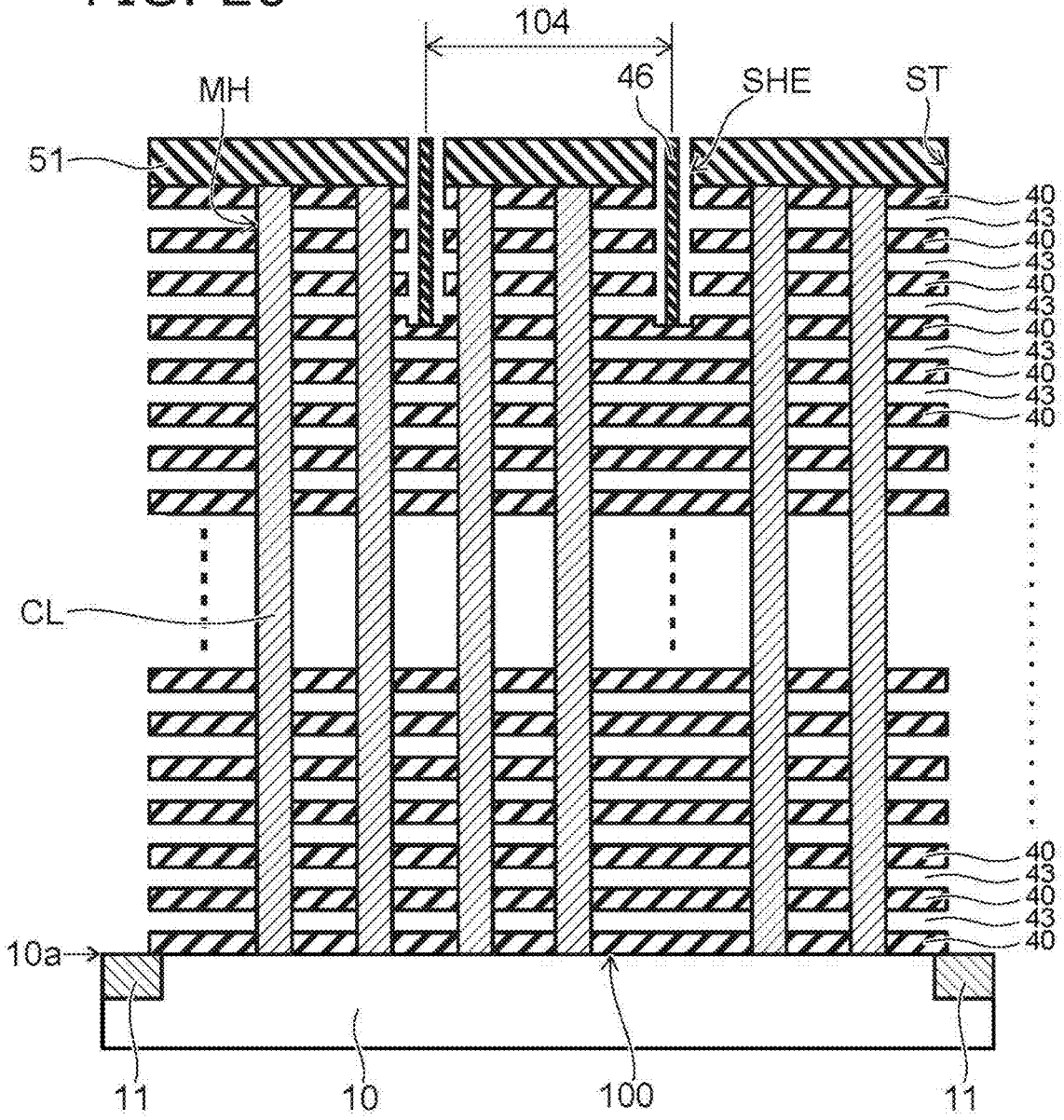
FIG. 26 is a schematic cross-sectional view showing a method of manufacturing the semiconductor device of the fifth embodiment.

As shown in FIG. 26, the first sacrificial layer 47 and the third sacrificial layer 49 are removed via the first slit ST and the second slit SHE. Accordingly, the space 43 is formed between the insulators 40. In the embodiment, the first sacrificial layer 47 and the third sacrificial layer 49 are removed, and the space 43 is formed even in the region 104 interposed between the second slits. In the embodiment, the third sacrificial layer 49 is formed in the second slit SHE. For this reason, the space 43 can be formed even in the region 104 interposed between the second slits.

10. Burying of Electrode Layer 41 (Replacement Staircase)

Figure 27:
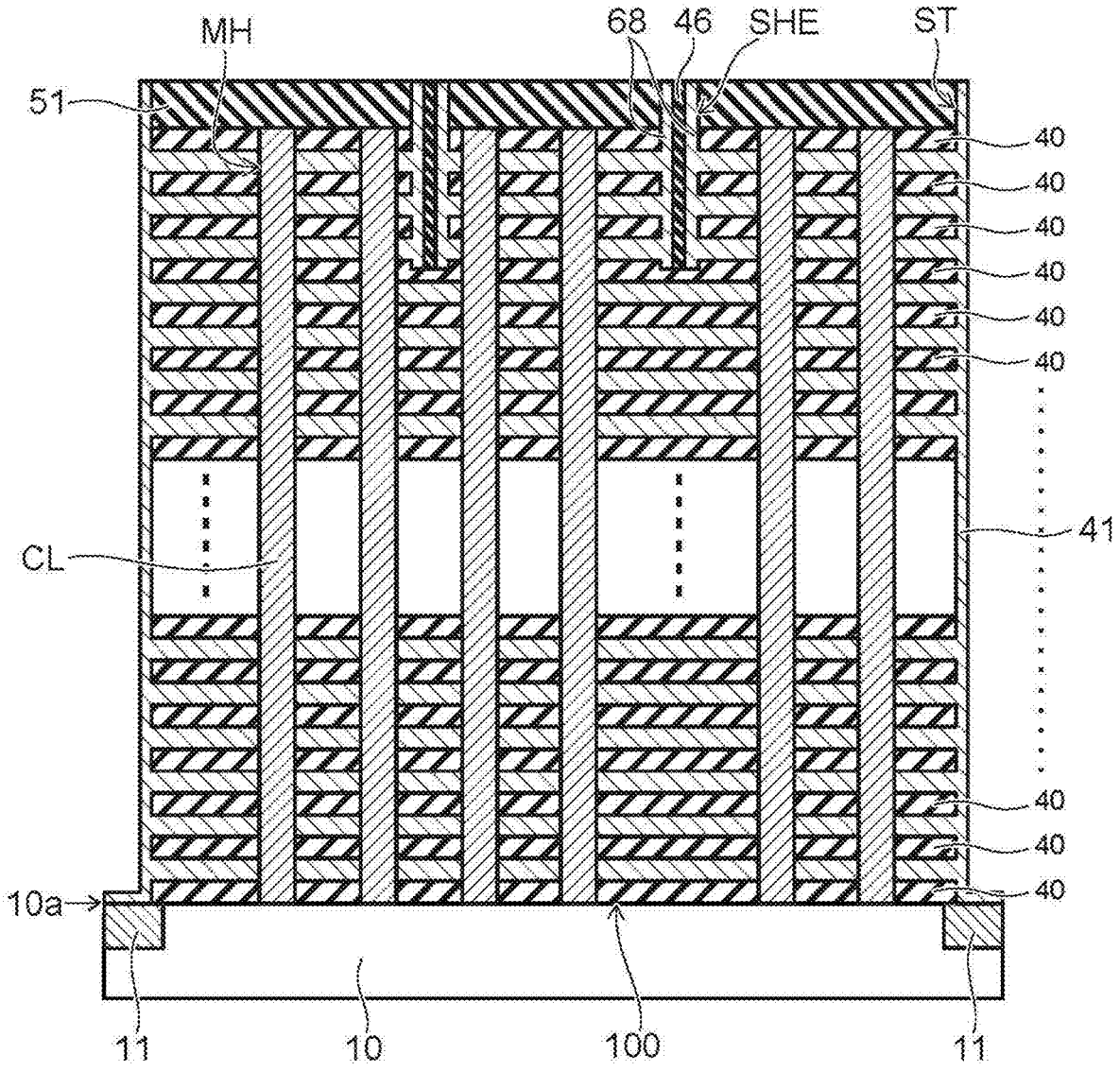
FIG. 27 is a schematic cross-sectional view showing a method of manufacturing the semiconductor device of the fifth embodiment.

As shown in FIG. 27, the space 43 is buried by the electrode layer 41. Accordingly, the electrode layer 41 and the eighth interconnection 68 are formed in the stacked body 100.

11. Formation of First Insulating Layer 45

Figure 28:
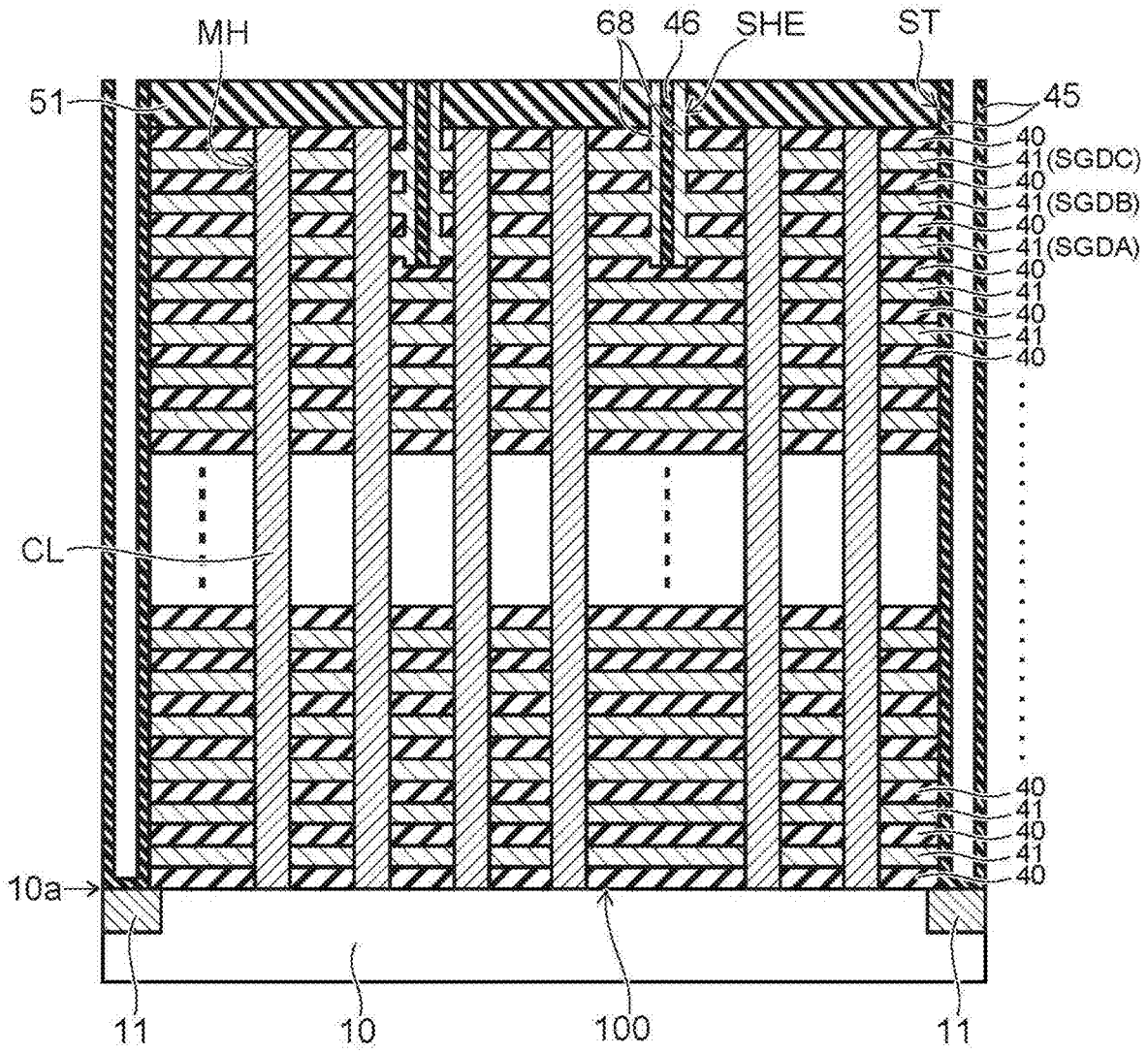
FIG. 28 is a schematic cross-sectional view showing a method of manufacturing the semiconductor device of the fifth embodiment.

As shown in FIG. 28, the electrode layer 41 is removed from the side wall of the first slit ST. Next, the first insulating layer 45 is formed on the side wall of the first slit ST.

12. Formation of Conductive Layer LI

Figure 29:
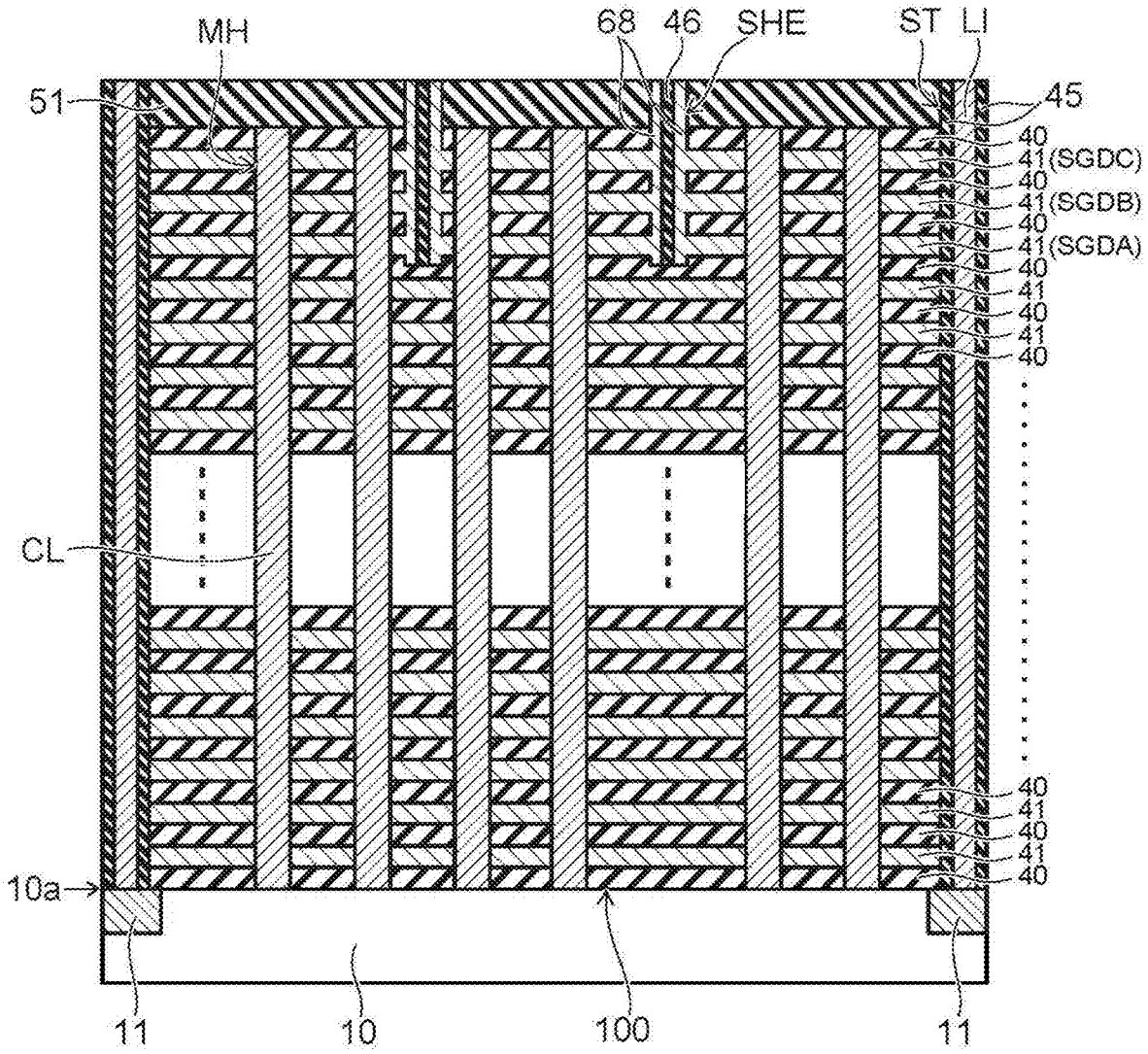
FIG. 29 is a schematic cross-sectional view showing a method of manufacturing the semiconductor device of the fifth embodiment.

As shown in FIG. 29, the first insulating layer 45 is removed from the bottom of the first slit ST. Accordingly, the semiconductor layer 11 is exposed to the bottom of the first slit ST. Next, the conductive layer LI is formed in the first slit ST. The conductive layer LI is electrically connected to the semiconductor 11.

13. Formation of First Conductive Material M

Figure 30:
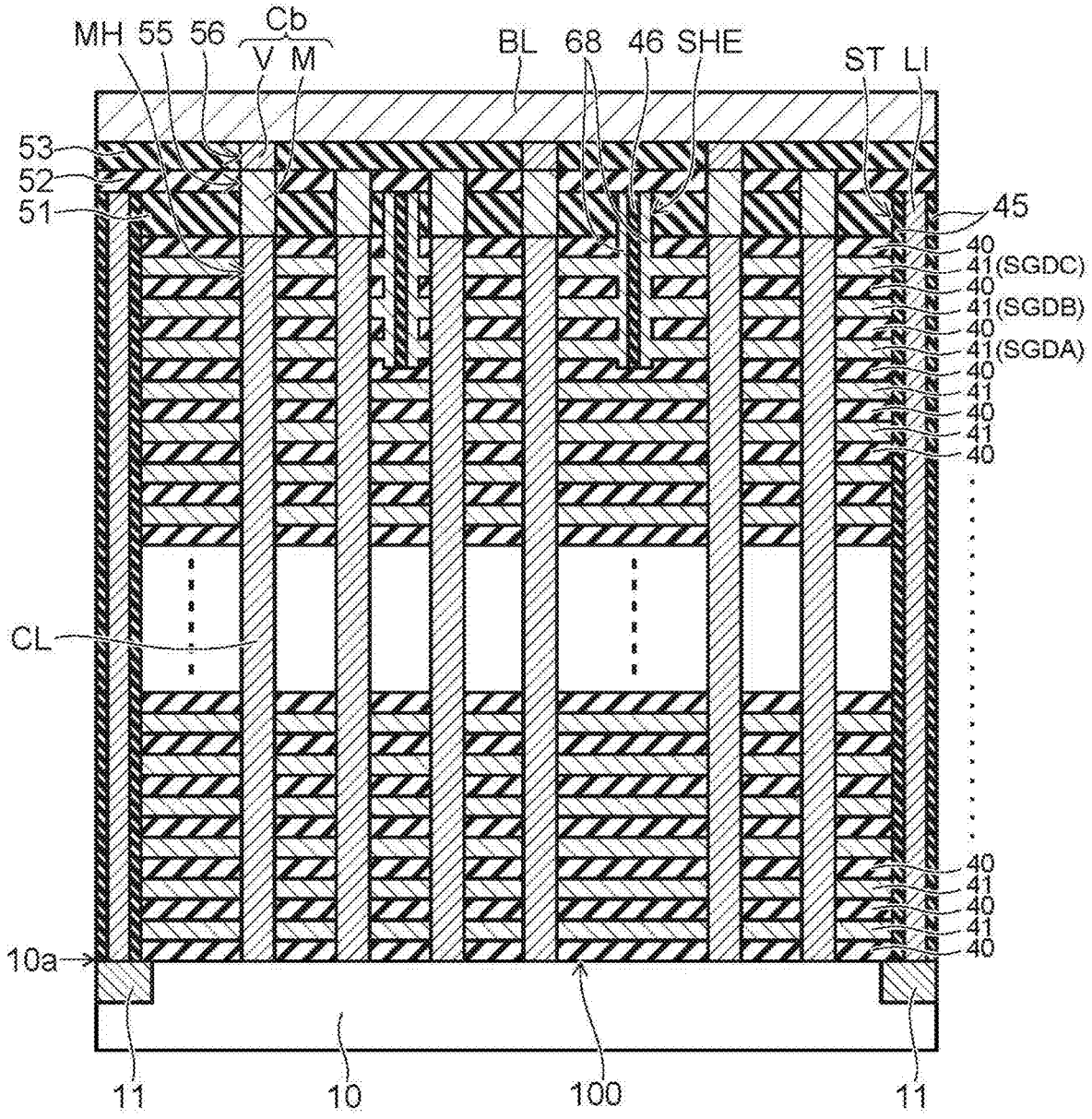
FIG. 30 is a schematic cross-sectional view showing a method of manufacturing the semiconductor device of the fifth embodiment.

As shown in FIG. 30, a fourth insulating layer 52 is formed on the stacked body 100 on which the conductive layer LI is formed. The fourth insulating layer 52 contains an insulating material. The insulating material is, for example, silicon oxide. Next, a first opening 55 is formed in the fourth insulating layer 52 and a third insulating layer 51. The first opening 55 reaches the column-shaped portion CL. Next, a first conductive material M is formed in the first opening 55. The first conductive material M contains, for example, W. The first conductive material M is electrically connected to the semiconductor body 20 (not shown) of the column-shaped portion CL.

14. Formation of Second Conductive Material V

Next, a fifth insulating layer 53 is formed on the stacked body 100 on which the first conductive material M is formed.

The fifth insulating layer 53 contains an insulating material. The insulating material is, for example, silicon oxide.

Next, a second opening 56 is formed in the fifth insulating layer 53. The second opening 56 reaches the first conductive material M. Next, a second conductive material V is formed in the second opening 56. The second conductive material V contains, for example, W. The second conductive material V is electrically connected to the first conductive material M. The first conductive material M and the second conductive material V constitute the contact Cb shown in, for example, FIG. 2.

15. Formation of Bit Line BL

Next, the bit line BL is formed on the stacked body 100 on which the second conductive material V is formed.

The semiconductor device of the fifth embodiment may be manufactured, for example, by the manufacturing method shown in FIGS. 19 to 30.

Heretofore, the first to fifth embodiments have been described. However, the embodiment is not limited to the first to fifth embodiments. These embodiments are presented as examples and are not intended to limit the scope of the invention. These novel embodiments may be implemented in various other forms, and various omissions, substitutions, and changes may be made without departing from the spirit of the invention.

The invention claimed is:

1. A semiconductor device comprising:

a stacked body including a first electrode layer and a second electrode layer provided to be electrically insulated from the first electrode layer in a stacking direction, *the stacked body including a first staircase portion provided in a first end region in a first direction intersecting the stacking direction, and a second staircase portion provided in a second end region located on a side opposite to the first end region in the first region*;

at least two first insulating layers provided in the stacked body to range from an upper end of the stacked body to a lower end of the stacked body, and extending in [a] *the* first direction[intersecting the stacking direction;

a first staircase portion provided in a first end region of the stacked body between the at least two first insulating layers;

a second staircase portion provided in a second end region of the stacked body located on a side opposite to the first end region between the at least two first insulating layers; and]*;*

*at least two second insulating layers provided in the stacked body to range from the upper end of the stacked body to the lower end of the stacked body, and extending in the first direction;* a [second] *third* insulating layer extending in the first direction, provided in the stacked body between [the at least two first insulating layers,] *one of the at least two first insulating layers and one of the at least two second insulating layers,* and dividing the second electrode layer in [the first direction,] *the third direction intersecting the stacking direction and the first direction;*

*a plurality of first column-shaped portions extending in the stacking direction through the stacked body and arranged in at least four rows each extending in the first direction between the one of the at least two first insulating layers and the third insulating layer; and*

*a plurality of second column-shaped portions extending in the stacking direction through the stacked body and arranged in at least four rows each extending in the first direction between the one of the at least two second insulating layers and the third insulating layer,*

*wherein* a length in the first direction of the [second] *third* insulating layer [being] *is* longer than a length in the first direction of the second electrode layer and shorter than a length in the first direction of the [second] *first* electrode layer.

2. The device according to claim 1, wherein the first electrode layer is a word line, and the second electrode layer is a selection gate layer.

3. The device according to claim 2, wherein the word line is a dummy word line.

4. The device according to claim 1, wherein the [stacked body includes a] *plurality of* first column-shaped [portion provided in an intermediate region of the stacked body located between the first end region and the second end region, the first column-shaped portion extending in the stacking direction, and the first column-shaped portion includes:] *portions each includes:* a semiconductor body extending in the stacking direction; and

*a charge storage portion provided between the semiconductor body and the first electrode layer, and*

*the plurality of second column-shaped portions each includes:*

*a semiconductor body extending in the stacking direction; and* a charge storage portion provided between the semiconductor body and the first electrode layer.

5. A semiconductor device comprising:

a stacked body including a first electrode layer, a second electrode layer, and a third electrode layer, the second electrode layer provided to be electrically insulated from the first electrode layer in a stacking direction, the third electrode layer interposed between the second electrode layer and the first electrode layer in the stacking direction and provided to be electrically insulated *from the second electrode layer, the stacked body including a first staircase portion provided in a first end region in a first direction intersecting the stacking direction, and a second staircase portion provided in a second end region located on a side opposite to the first end region in the first region*;

at least two first insulating layers provided in the stacked body to range from an upper end of the stacked body to a lower end of the stacked body, and extending in [a] *the* first direction[intersecting the stacking direction;

a first staircase portion provided in a first end region of the stacked body between the at least two first insulating layers;

a second staircase portion provided in a second end region of the stacked body located on a side opposite to the first end region between the at least two first insulating layers;

a second insulating layer extending in the first direction, the second insulating layer provided in the stacked body between the at least two first insulating layers, and dividing the second electrode layer in the first direction; and an interconnection electrically connecting the first electrode layer and the third electrode layer in the stacked body.]*;*

*at least two second insulating layers provided in the stacked body to range from the upper end of the stacked body to the lower end of the stacked body, and extending in the first direction;*

*a third insulating layer extending in the first direction, the third insulating layer provided in the stacked body between one of the at least two first insulating layers and one of the at least two second insulating layers, and dividing the second electrode layer in a third direction intersecting the stacking direction and the first direction;*

*a plurality of first column-shaped portions extending in the stacking direction through the stacked body and arranged in at least four rows each extending in the first direction between the one of the at least two first insulating layers and the third insulating layer;*

*a plurality of second column-shaped portions extending in the stacking direction through the stacked body and arranged in at least four rows each extending in the first direction between the one of the at least two second insulating layers and the third insulating layer; and*

*an interconnection electrically connecting the first electrode layer and the third electrode layer.*

6. The device according to claim 5, wherein the first electrode layer is a first word line, the second electrode layer is a selection gate layer, and the third electrode layer is a second word line.

7. The device according to claim 6, wherein the first word line is a first dummy word line, and the second word line is a second dummy word line.

8. The device according to claim 6, wherein the [second] *third* insulating layer divides the first word line in the [first] *third* direction.

9. The device according to claim 5, wherein

[the stacked body includes a first column-shaped portion provided in an intermediate region of the stacked body located between the first end region and the second end region, the first column-shaped portion extending in the stacking direction, and the first column-shaped portion includes:]

*the plurality of first column-shaped portions each includes:*

*a semiconductor body extending in the stacking direction; and*

*a charge storage portion provided between the semiconductor body and the first electrode layer, and*

*the plurality of second column-shaped portions each includes:* a semiconductor body extending in the stacking direction; and a charge storage portion provided between the semiconductor body and the first electrode layer.

10. The device according to claim 5, wherein the interconnection is provided outside the stacked body, and the interconnection is provided [above at least one of the first end region and the second end region.] *below the third insulating layer.*

[11. The device according to claim 5, wherein the interconnection is provided in the stacked body, and the interconnection is provided below the second insulating layer.]

[12. The device according to claim 11, wherein the stacked body includes a second column-shaped portion penetrating the second insulating layer and extending in the stacking direction, the second column-shaped portion has the same structure as the fiat column-shaped portion, and the interconnection is provided along the second column-shaped portion.]

[13. A semiconductor device, comprising:

a stacked body including a first electrode layer, a second electrode layer provided to be electrically insulated from the first electrode layer in a stacking direction, and a third electrode layer provided to be electrically insulated from the second electrode layer in the stacking direction;

at least two first insulating layers provided in the stacked body to range from an upper end of the stacked body to a lower end of the stacked body, and extending in a first direction intersecting the stacking direction;

a first staircase portion provided in a first end region of the stacked body between the at least two first insulating layers;

a second staircase portion provided in a second end region of the stacked body located on a side opposite to the first end region between the at least two first insulating layers;

a second insulating layer extending in the first direction, the second insulating layer provided in the stacked body between the at least two first insulating layers, and dividing the second electrode layer and the third electrode layer in the first direction; and an interconnection electrically connecting the second electrode layer and the third electrode layer in the stacked body.]

[14. The device according to claim 13, wherein the first electrode layer is a word line, the second electrode layer is a first selection gate layer, and the third electrode layer is a second selection gate layer.]

[15. The device according to claim 14, wherein the word line is a dummy word line.]

[16. The device according to claim 13, wherein the stacked body includes a first column-shaped portion provided in an intermediate region of the stacked body located between the first end region and the second end region, the first column-shaped portion extending in the stacking direction, and the first column-shaped portion includes:

a semiconductor body extending in the stacking direction; and a charge storage portion provided between the semiconductor body and the first electrode layer.]

[17. The device according to claim 13, wherein the interconnection is provided in the stacked body, and the interconnection is provided along the second insulating layer.]

[18. The device according to claim 13, further comprising a third insulating layer extending in the first direction, the third insulating layer provided in the stacked body between the first insulating layer and the second insulating layer, and dividing the second electrode layer and the third electrode layer in the first direction.]

*19. The device according to claim 1, wherein:*

*the first staircase portion is provided in the first end region of the stacked body between the at least two first insulating layers; and*

*the second staircase portion is provided in the second end region of the stacked body located on the side opposite to the first end region between the at least two first insulating layers.*

*20. The device according to claim 19, wherein*

*the plurality of first column-shaped portions are provided in an intermediate region of the stacked body located between the first end region and the second end region, and*

*the plurality of second column-shaped portions are provided in the intermediate region of the stacked body.*

*21. The device according to claim 10, further comprising a third column-shaped portion extending in the stacked body in the stacking direction, wherein*

*the third insulating layer extends in the third column-shaped portion in the stacking direction,*

*the third column-shaped portion has the same structure as one of the plurality of first column-shaped portions, and*

*the interconnection is provided along the third column-shaped portion.*

*22. The device according to claim 5, wherein:*

*the first staircase portion provided in the first end region of the stacked body between the at least two first insulating layers; and*

*the second staircase portion provided in the second end region of the stacked body located on the side opposite to the first end region between the at least two first insulating layers.*

*23. The device according to claim 22, wherein*

*the plurality of first column-shaped portions are provided in an intermediate region of the stacked body located between the first end region and the second end region, and*

*the plurality of second column-shaped portions are provided in the intermediate region of the stacked body.*

*24. The device according to claim 22, wherein*

*the interconnection is provided outside the stacked body, and*

*the interconnection is provided above at least one of the first end region and the second end region.*

*25. The device according to claim 5, wherein the interconnection electrically connecting the first electrode layer and the third electrode layer in the stacked body.*

*26. A semiconductor device, comprising:*

*a stacked body including a first electrode layer, a second electrode layer provided to be electrically insulated from the first electrode layer in a stacking direction, and a third electrode layer provided to be electrically insulated from the second electrode layer in the stacking direction, the stacked body including a first staircase portion provided in a first end region in a first direction intersecting the stacking direction, and a second staircase portion provided in a second end region located on a side opposite to the first end region in the first region;*

*at least two first insulating layers provided in the stacked body to range from an upper end of the stacked body to a lower end of the stacked body, and extending in the first direction;*

*at least two second insulating layers provided in the stacked body to range from the upper end of the stacked body to the lower end of the stacked body, and extending in the first direction;*

*a third insulating layer extending in the first direction, the third insulating layer provided in the stacked body between one of the at least two first insulating layers and one of the at least two second insulating layers, and dividing the second electrode layer and the third electrode layer in a third direction intersecting the stacking direction and the first direction;*

*a plurality of first column-shaped portions extending in the stacking direction through the stacked body and arranged in at least four rows each extending in the first direction between the one of the at least two first insulating layers and the third insulating layer;*

*a plurality of second column-shaped portions extending in the stacking direction through the stacked body and arranged in at least four rows each extending in the first direction between the one of the at least two second insulating layers and the third insulating layer; and*

*an interconnection electrically connecting the second electrode layer and the third electrode layer.*

*27. The device according to claim 26, wherein*

*the first electrode layer is a word line,*

*the second electrode layer is a first selection gate layer, and*

*the third electrode layer is a second selection gate layer.*

*28. The device according to claim 27, wherein the word line is a dummy word line.*

*29. The device according to claim 27, further comprising a fifth insulating layer extending in the first direction, the fifth insulating layer provided in the stacked body between one of the at least two first insulating layers and the third insulating layer, and dividing the second electrode layer and the third electrode layer in the third direction.*

*30. The device according to claim 26, wherein*

*the plurality of first column-shaped portions each includes:*

*a semiconductor body extending in the stacking direction; and*

*a charge storage portion provided between the semiconductor body and the first electrode layer, and*

*the plurality of second column-shaped portions each includes:*

*a semiconductor body extending in the stacking direction; and*

*a charge storage portion provided between the semiconductor body and the first electrode layer.*

*31. The device according to claim 26, wherein*

*the interconnection is provided in the stacked body, and*

*the interconnection is provided along the third insulating layer.*

*32. The device according to claim 26, further comprising:*

*the first staircase portion provided in the first end region of the stacked body between the at least two first insulating layers; and*

*the second staircase portion provided in the second end region of the stacked body located on the side opposite to the first end region between the at least two first insulating layers.*

*33. The device according to claim 26, wherein the interconnection electrically connecting the second electrode layer and the third electrode layer in the stacked body.*

* * * * *